(12) United States Patent
Shibata

(10) Patent No.: US 6,815,832 B2
(45) Date of Patent: Nov. 9, 2004

(54) SEMICONDUCTOR DEVICE HAVING OPPOSED AND CONNECTED SEMICONDUCTOR CHIPS WITH LATERAL DEVIATION CONFIRMING ELECTRODES

(75) Inventor: Kazutaka Shibata, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/255,958

(22) Filed: Sep. 27, 2002

(65) Prior Publication Data

US 2003/0062611 A1 Apr. 3, 2003

(30) Foreign Application Priority Data

Sep. 28, 2001 (JP) .......................................... 2001-302289
Nov. 5, 2001 (JP) .......................................... 2001-339907

(51) Int. Cl.⁷ ........................... H01L 23/48; H01L 23/52
(52) U.S. Cl. ....................... 257/778; 257/685; 257/686; 257/777; 257/723
(58) Field of Search ................................. 257/685, 686, 257/777, 723, 676, 778, 773, 786, 690, 691, 787, 684, 784, 737, 738

(56) References Cited

U.S. PATENT DOCUMENTS 5,894,165 A * 4/1999 Ma et al.
6,175,157 B1 * 1/2001 Morifuji
6,285,084 B1 * 9/2001 Hikita et al. ................ 257/777
6,509,634 B1 * 1/2003 Lee et al.

\* cited by examiner

Primary Examiner—Long Pham
Assistant Examiner—DiLinh Nguyen
(74) Attorney, Agent, or Firm—Rabin & Berdo, P.C.

(57) ABSTRACT

A semiconductor device having first and second semiconductor chips opposed and connected, at respective active surfaces, to each other. The first semiconductor chip has a first internal connection electrode and a first lateral-deviation confirming electrode. The second semiconductor chip has a second internal connection electrode and a second lateral-deviation confirming electrode. The first and second lateral-deviation confirming electrodes are arranged on the respective active surfaces of the first and second semiconductor chips in a positional relationship that mutual connection is made when the first and second internal connection electrodes are connected together in a predetermined relative position in an on-plane direction of the active surface but mutual connection is not made when the first and second internal connection electrodes deviate by a constant distance or greater in a predetermined lateral-deviation detecting direction on the plane of the active surface within a range to keep mutual connection thereof.

14 Claims, 12 Drawing Sheets

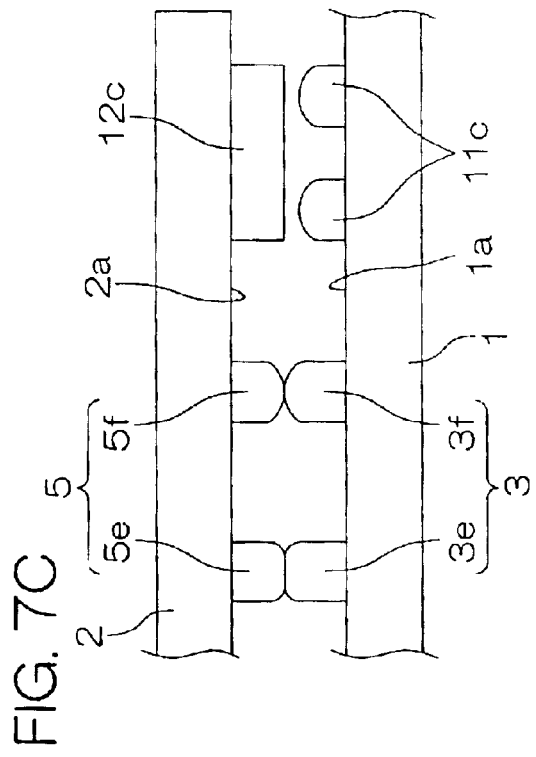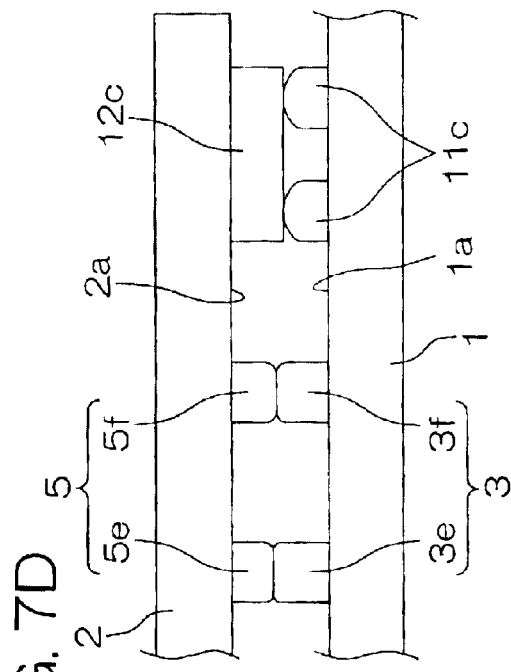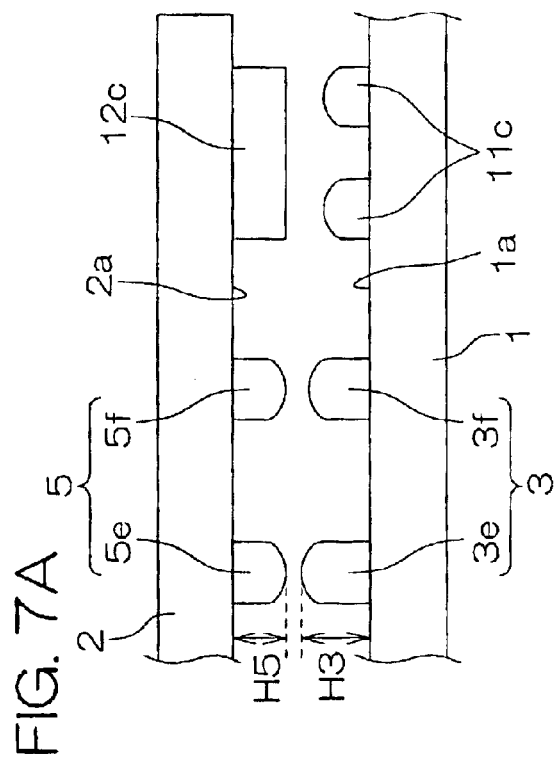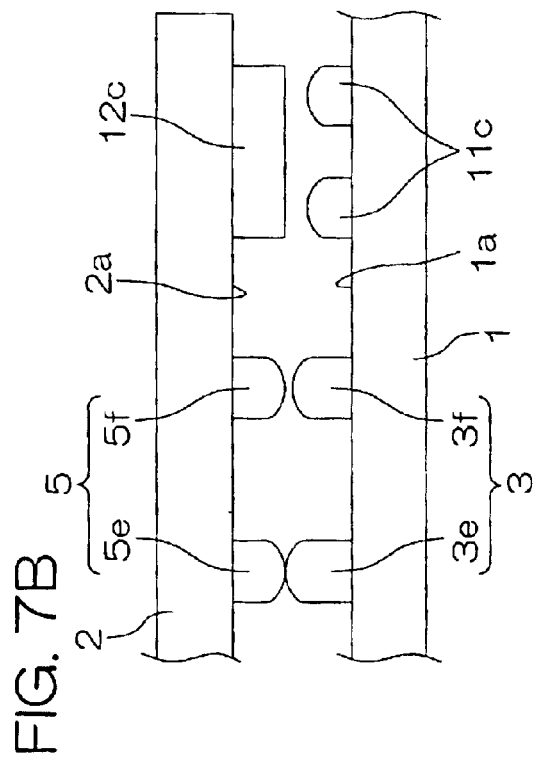

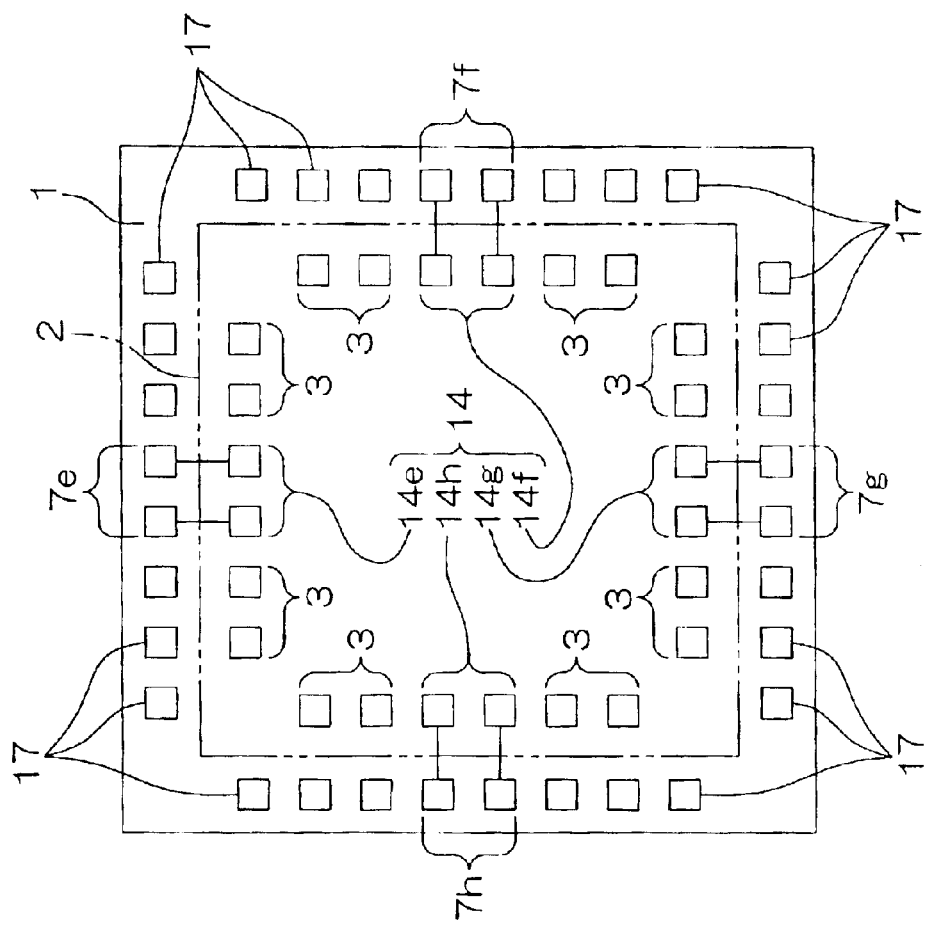
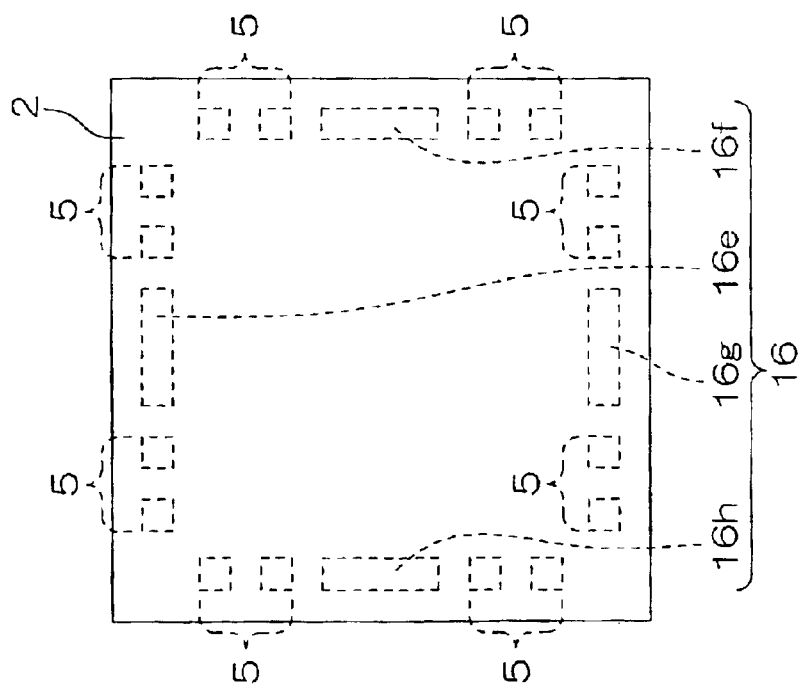

SEMICONDUCTOR DEVICE HAVING OPPOSED AND CONNECTED SEMICONDUCTOR CHIPS WITH LATERAL DEVIATION CONFIRMING ELECTRODES

BACKGROUND OF THE INVENTION

1. Field of the Invention

This invention relates to a semiconductor device having a chip-on-chip structure having a semiconductor chip superposed with another semiconductor chip thereon.

2. Description of Related Art

There is a chip-on-chip structure having a pair of semiconductor chips connected together by being opposed at their active surfaces, as one form of a multi-chip semiconductor device having a plurality of semiconductor chips connected with one another to be molded with a resin. In the semiconductor device of such a structure, a pair of semiconductor chips formed with internal connection electrodes in the active surfaces are opposed at their active surfaces and connected together by being aligned on the active surface such that the corresponding ones of internal connection electrodes are connected (internally connected) together.

The internal connection electrodes are formed as bumps projecting from the active surface. The internal connection electrodes, however, have deviations in height. Consequently, when the semiconductor chips at the active surfaces are opposed in parallel with each other, the corresponding internal connection electrodes in each set are not constant in the sum of their heights. For this reason, the internal connection electrodes have a narrow spacing in a set having a greater height sum while the internal connection electrodes have abroad spacing in a set having a smaller height sum. During interconnecting the internal connection electrodes, by crushing under pressure the internal connection electrodes of the set greater in height sum, mutual connection is provided on all the internal connection electrodes including the internal connection electrodes smaller in height sum.

External extension electrodes are provided on one of a pair of semiconductor chips to be connected chip on chip. The external extension electrodes are connected to an external connection member, such as a leadframe. Through the external connection member, the semiconductor device can be connected to another circuit board. In the case internal connection is properly done, a predetermined input/output characteristic is obtained through the external connection member as terminals.

A multiplicity of internal connection electrodes are provided on each semiconductor chip. Unless interconnections are all proper on the corresponding internal connection electrodes, the semiconductor device cannot have a predetermined input/output characteristic hence resulting in the unacceptable product. Confirming an internal connection state is made not only on a completed semiconductor device but also as an intermediate test in the manufacturing process. In the intermediate test, electric characteristics are measured through the external extension electrodes in order to confirm a normality/abnormality of internal connection. Namely, a probe for electrical-characteristic measurement is put on every external extension electrode to examine whether a desired input/output characteristic is available or not. Besides, measurement is made for a conduction at between the external extension electrodes in a particular set.

However, despite electrical connection is made between all the corresponding ones of the internal connection electrodes, there are cases that junction is provided between the internal connection electrodes with a deviation on the active surface from a predetermined relative position. In such a case, junction area is smaller as compared to the case where connection is made in a predetermined relative position between the internal connection electrodes. This reduces the mechanical strength at the junctions, resulting in a fear of a fracture at the junctions even under an application of slight loading. Consequently, the semiconductor device having such junctions between the internal connection electrodes should be determined unacceptable.

However, even in such a case, determination is frequently made as proper in the conventional electrical-method test. This is because a rise in electrical resistance is not to be recognized unless the junction area is decreased between the internal connection electrodes to a considerable extent. It is impossible to determine a size of an junction area in the electrical test.

Meanwhile, even where alignment is accurately done on the active surface, when connection is made between the internal connection electrodes under pressurization or the like, there is a decrease in junction area on the internal connection electrodes in a set having a small height sum. In case there are a number of internal connection electrodes small in junction area, there is a possibility not to provide a junction with sufficient strength at between semiconductor chips through internal connection electrodes. In such a case, junction normality/abnormality cannot be determined in the conventional test method.

Furthermore, poor internal connection, in many cases, results from nonparallel arrangement at the active surfaces of a pair of semiconductor chips to be mutually connected. In such a case, the above frequently causes non-connection at between the internal connection electrodes or unstable connection thereof, in a region the spacing is great between the active surfaces. For such a simple cause of poor connection, the conventional semiconductor device must be examined for a conduction and input/output characteristic by putting a probe on every external extension electrode, thus requiring time and cost upon testing.

SUMMARY OF THE INVENTION

It is an object of the present invention to provide a semiconductor device capable of determining whether internal connection has been properly done or not.

Also, another object of the invention is to provide a semiconductor device capable of simply determining a normality/abnormality of internal connection.

A semiconductor device according to one aspect of the invention comprises a first semiconductor chip having, on an active surface, a first internal connection electrode and a first lateral-deviation confirming electrode and a second semiconductor chip having, on an active surface, a second internal connection electrode corresponding to the first internal connection electrode and a second lateral-deviation confirming electrode corresponding to the first lateral-deviation confirming electrode, that are connected opposed at the respective active surfaces. The first lateral-deviation confirming electrode and the second lateral-deviation confirming electrode are arranged in such positions that mutual connection is made when the first internal connection electrode and the second internal connection electrode are connected together in a predetermined relative position in an on-plane direction of the active surface but mutual connection is not made when the first internal connection electrode and the second internal connection electrode deviate by a constant distance or greater in a predetermined lateral-deviation detecting direction on a plane of the active surface within a range to keep mutual connection thereof.

The internal connection electrode and the lateral-deviation confirming electrode may be in a projection (bump) form projecting from the active surface.

According to the invention, even where all the corresponding first and second internal connection electrodes are electrically connected together, when these are connected with a deviation by a predetermined distance or greater in a predetermined lateral-deviation detecting direction from a predetermined relative position on the active plane, connection is not made between the first and second lateral-deviation confirming electrodes. Accordingly, in the case where no electrical conduction is available at between the first and second lateral-deviation confirming electrodes, it is possible to determine that the first and second internal connection electrodes are deviated by a predetermined distance or greater from the predetermined relative position in an on-plane direction of the active surface.

In such a case, the corresponding first and second internal connection electrodes, even if connected to have an electrical conduction, have a decreased junction area and hence a low mechanical strength at the junction. Accordingly, such a semiconductor device can be determined as to whether or not internal connection has been done with a sufficient mechanical strength by examining a presence or absence of an electrical conduction at between the first and second lateral-deviation confirming electrodes.

It is preferred that the first semiconductor chip further comprises a pair of conduction confirming electrodes respectively connected to the first lateral-deviation confirming electrode and the first internal connection electrode, the second semiconductor chip further comprises a wiring connecting between the second lateral-deviation confirming electrode connected to the first lateral-deviation confirming electrode and the second internal connection electrode connected to the first internal connection electrode.

In this case, by examining an electrical conduction at between a pair of conduction confirming electrodes, confirmation is possible on whether or not the first and second lateral-deviation confirming electrodes are electrically connected together.

The size and form of the first and second lateral-deviation confirming electrodes can be desirably defined as long as the foregoing role is to be played. For example, the first and second lateral-deviation confirming electrodes and the first and second internal connection electrodes may be all made in the same size and form. In this case, when the first and second internal connection electrodes are in a predetermined relative position, the first and second lateral-deviation electrodes may be arranged overlapped with a positional deviation from each other. The first and second lateral-deviation confirming electrodes may have different size and form respectively.

One of the first and second lateral-deviation confirming electrodes may be a connection confirming electrode pair including two electrodes. In this case, the other of the first and second lateral-deviation confirming electrodes may be a shorting wiring to electrically short between the connection confirming electrodes in the pair. The two electrodes constituting the connection confirming electrode pair may be placed in an electrically insulated state when not connected by the shorting wiring.

In this case, the connection confirming electrode pair may be provided to be shorted by the shoring wiring when the first and second internal connection electrodes are connected together in a predetermined relative position but not to be shorted when the first and second internal connection electrodes are deviated by a predetermined distance or greater in a predetermined direction on the active surface within a range to keep mutual connection. In also this case, it is similarly possible to know a deviation in the on-plane direction of the active surface by examining a presence or absence of an electrical conduction at between the paired connection confirming electrodes. Thus, determination is possible as to whether the first and second internal connection electrodes are connected with a sufficient junction strength.

It is preferred to provide the first and second lateral-deviation confirming electrodes in a plurality of sets. In this case, there is preferably provided a difference in the predetermined lateral-deviation detecting direction between at least two sets of first and second lateral-deviation confirming electrodes.

According to this structure, in the case where the first and second internal connection electrodes deviate by a predetermined distance or greater from a predetermined relative position in any of a plurality of predetermined lateral-deviation detecting directions on the active surface, contact is not made between the first and second lateral-deviation confirming electrodes in any of the sets. Namely, by examining a presence or absence of an electrical conduction between the first and second lateral-deviation confirming electrodes, it is possible to know a deviation of the first and second internal connection electrodes in a plurality of directions on the active surface.

The first and second lateral-deviation confirming electrodes can be provided four sets not to be connected when the first and second internal connection electrodes deviate by a predetermined distance or greater in any of four lateral-deviation detecting directions given at an angular interval of 90 degrees as viewed from a center of the first and second semiconductor chips. In this case, the first and second internal connection electrodes, even where deviated in any direction on the active surface, can be known of a deviation by a presence or absence of an electrical conduction between the first and second lateral-deviation confirming electrodes.

A semiconductor device according to another aspect of the invention is constructed in such a manner that a first semiconductor chip having a plurality of first internal connection electrodes and a first reference-height electrode that project from the active surface, and a second semiconductor chip having a plurality of second internal connection electrodes corresponding to the first internal connection electrodes and a second reference height electrode corresponding to the first reference height electrode that project from the active surface are connected with active faces opposed at each other. The sum of a height of the first reference height electrode and a height of a second reference height electrode, prior to connection, is smaller than a minimum one of the sums of a height of the internal connection electrode and a height of the corresponding second internal connection electrode, prior to connection.

According to the invention, when the first and second semiconductor chips are approached with the respective active surfaces positioned in parallel with each other, contacted first is the one greatest in height sum of among the corresponding first and second internal connection electrodes. By pressurization for example, the first and second internal connection electrodes greater in height sum are crushed and the active surfaces are approached furthermore.

Thereupon, the first and second internal connection electrodes in the sets are connected in the order of greater height sum thereof. After connection at between the first and second internal connection electrodes minimal in height sum, connection (contact) is made between the first and second reference height electrodes.

Namely, in case the first and second reference height electrodes have been connected (contacted), it means that connection has been done on all the sets of first and second internal connection electrodes. Where the sum of the first and second reference height electrodes is sufficient small, when the active surfaces are approached until the first and second reference height electrodes connect (contact) with each other, the minimal ones in height sum of the first and second internal connection electrodes are connected together with a sufficient mechanical strength.

It is practically impossible to measure, on each of the first and second semiconductor chips, each height of the first and second internal connection electrodes and then adjust a height of the reference height electrode to a height meeting the foregoing condition on the basis of the measured value. Accordingly, the first and second reference height electrodes can be provided with a height of a constant value based on the previously-measured height data on a certain number of first and second internal connection electrodes.

Herein, it is assumed that the mean values of previously-measured heights of the first and second internal connection electrodes are $a1$, $a2$ and the standard deviations thereof are $\sigma1$, $\sigma2$. It is also assumed that the weight load in connecting the first and second internal connection electrodes together is in a magnitude to connect all the first and second internal connection electrodes having height deviations of $\pm 3\sigma1$, $\pm 3\sigma2$. The first and second reference height electrodes can be given $a1-3\sigma1$, $a2-3\sigma2$, for example.

In this case, the first reference electrode, in many cases, has a height sufficiently lower than the lowest of the first internal connection electrodes. Also, the second reference electrode, in many cases, has a height sufficiently lower than the lowest of the second internal connection electrodes. It is noted herein that the internal connection electrodes are assumably sufficient small in the number. Accordingly, on one semiconductor device, the height sum of the first and second reference height electrodes are, in most cases, given sufficiently smaller than the minimal one in height sum of the corresponding first and second internal connection electrodes. Due to this, in almost all the cases, the connection state between the first and second internal connection electrodes is proper in case the first and second reference height electrodes are in contact with each other.

The first and second internal connection electrodes and the first and second reference height electrodes can be formed by plating, for example. On this occasion, only the first and second internal connection electrodes are grown by respective heights of $3\sigma1$ and $3\sigma2$. Thereafter, the first internal connection electrode and the first reference height electrode are simultaneously grown by a height of $a1-3\sigma1$ while the second internal connection electrode and the second reference height electrode are simultaneously grown by a height of $a2-3\sigma2$. This provides the first and second internal connection electrodes with respective heights of $a1-3\sigma1$, and the first and second reference height electrode with respective heights of $a2-3\sigma2$.

Because the first and second reference height electrodes must be made correctly in a predetermined height, fine adjustment may be done by etching or the like after forming by plating.

Incidentally, the electrodes, provided on the first and second semiconductor chips to constitute respective sets, may be structured to serve as both the first and second lateral-deviation confirming electrodes and the first and second reference height electrodes.

A semiconductor device according to still another aspect of the invention comprises a first semiconductor chip having an internal connection electrode and at least one pair of connection confirming electrodes and a second semiconductor chip connected opposed to the first semiconductor chip and having an internal connection electrode corresponding to the internal connection electrode of the first semiconductor chip and a shorting wiring shorting between the connection confirming electrodes in the pair.

The connection confirming electrode pair can include two electrodes in an electrically insulated state when not connected by the shorting wiring. The internal connection electrodes may be formed as projections (bumps). In this case, the internal connection electrode and the connection confirming electrode pair on the first semiconductor chip can be structured as projections in the same height while the internal connection electrode and the shorting wiring on the second semiconductor chip can be structured as projections in the same height.

The internal connection electrode may be provided in plurality. The connection confirming electrode pair is preferably arranged close to any of the internal connection electrodes. Meanwhile, the connection confirming electrode pair is preferably arranged at least three pairs spaced one from another. For example, they can be arranged in a position corresponding to a vicinity of a peripheral edge of the second semiconductor.

According to the invention, in the case where the first and second semiconductor chips at active surfaces (surface forming the internal connection electrode) are in parallel with each other, all the corresponding internal connection electrodes are properly connected, and the connection confirming electrode pair is connected with the shorting wiring to be made into a shorted state. Accordingly, electrical resistance is low in any pair of the connection confirming electrodes.

On the other hand, when the first and second semiconductor chips at active surfaces are not in parallel with each other, connection is possibly not proper on the internal connection electrode in the vicinity of a region in which the spacing between the active surface is the greatest. Also, in case the connection confirming electrode pair is provided in the region in which the active surfaces are distant from each other, such connection confirming electrode pair is not to be sufficiently firmly connected (contacted) with or out of contact with the shorting wiring. Consequently, electrical resistance is high or no conduction is available between the pared connection confirming electrodes. Where there are provided at least three pairs of connection confirming electrodes are arranged spaced from one another, there is a high probability that any of the connection confirming electrode pairs exist in the vicinity of the region in which the spacing between the active surfaces is the greatest.

From the above, it is possible to presume whether the active surfaces are in parallel or not by examining an electrical resistance in each of the connection confirming electrode pairs. Namely, in case the electric resistance is lower than a predetermined value on all the connection confirming electrode pairs, the active surfaces are considered in parallel with each other. On the other hand, in case the electric resistance is higher than a predetermined value or no conduction is available on any of the connection confirming electrode pairs, the active surfaces are considered not in parallel with. In the case where the connection confirming electrode pair is arranged close to any internal connection electrode, there is a high possibility that there is a poor connection also on the internal connection electrode in the visinity of the connection confirming electrode pair high in electrical resistance (no conduction).

Accordingly, such a semiconductor device can be determined whether the internal connection electrode is properly connected or not, by merely measuring an electrical resistance between the pared connection confirming electrodes. Namely, the semiconductor device can be simply determined for normality/abnormality of internal connection. Also, because it can be considered that the spacing between the active surfaces is the greatest in the vicinity of the connection confirming electrode pair in which an electrical resistance is higher than a predetermined value or no conduction is available, it is also possible to simply know an approximate inclination direction of the active surface. It is satisfactory to conduct a detailed test by putting, as required, a probe on every external extension electrodes as before, only on the semiconductor device having an electrical resistance lower than a predetermined value in every connection confirming electrode pair.

The first semiconductor chip may further include external extension electrodes for connection to an external connection member, such as a leadframe. The external extension electrodes, in part, may be electrical-resistance measuring electrode pairs connected one-to-one to the connection confirming electrode pairs. In this case, an electrical resistance can be measured between the paired connection confirming electrodes by putting a probe on the electrical-resistance measuring electrode pair. Because the connection confirming electrode pairs exist between the first and second semiconductor chips, there is a difficulty in directly putting a probe on the connection confirming electrode pair. Contrary to this, the electrical-resistance measuring electrode pairs (external extension electrodes) are arranged in a region where the first and second semiconductor chips are not opposed, a probe can be easily put thereon to measure an electrical resistance. The connection confirming electrode pairs and shorting wirings are small in size and hence low in electrical resistance. Consequently, measuring an electrical resistance is preferably by a four terminal (probe) method in order to obtain correct measurement values.

The semiconductor device may include three or more semiconductor chips. Namely, a plurality of small semiconductor chips may be arranged on one large semiconductor chip. In this case, internal connection can be simply determined for normality/abnormality by a similar technique.

In the case where the second semiconductor chip is rectangular in plan view, the connection confirming electrode pair is preferably arranged, in plan view, in a position on the first semiconductor chip corresponding to a vicinity of a corner of the second semiconductor chip.

Where the active surfaces of the first and second semiconductor chips are not arranged parallel, the spacing between the active surfaces is the greatest at any corner of the second semiconductor chip. In case a connection confirming electrode pair exists in the region where the spacing between the active surfaces is the greatest in this manner, it is possible to locate with probability a poor connection of between the internal connection electrodes.

It is preferred to arrange connection confirming electrode pairs in positions on the first semiconductor chip corresponding to the vicinities of four corners of the second semiconductor chip. In this case, even when the active surface inclines in any direction, the connection confirming electrode pair necessarily exists in a vicinity of a region where the spacing between the active surfaces is the greatest. This makes it possible to locate a poor connection in the internal connection electrode with higher probability.

The internal connection electrodes may be provided, in plan view, both in a vicinity of a peripheral edge and an inner region on the second semiconductor chip. For example, the internal connection electrodes may be arranged in a lattice form extending over the entire active surface of the second semiconductor chip.

The above and other objects, features and effects of the present invention will be made more apparent by the explanation of embodiments which will be described below with reference to the accompanying drawings.

BRIEF DESCRIPTION OF THE DRAWINGS

FIGS. 7A–7D are illustrative side views showing a connection state of between parent and child chips of FIGS. 6A and 6B;

FIGS. 11A and 11B are illustrative plan views showing an arrangement of internal connection electrodes, connection confirming electrode pairs and shorting wirings on a semiconductor device according to a sixth embodiment of the invention.

DESCRIPTION OF THE PREFERRED EMBODIMENTS

Figure 1:
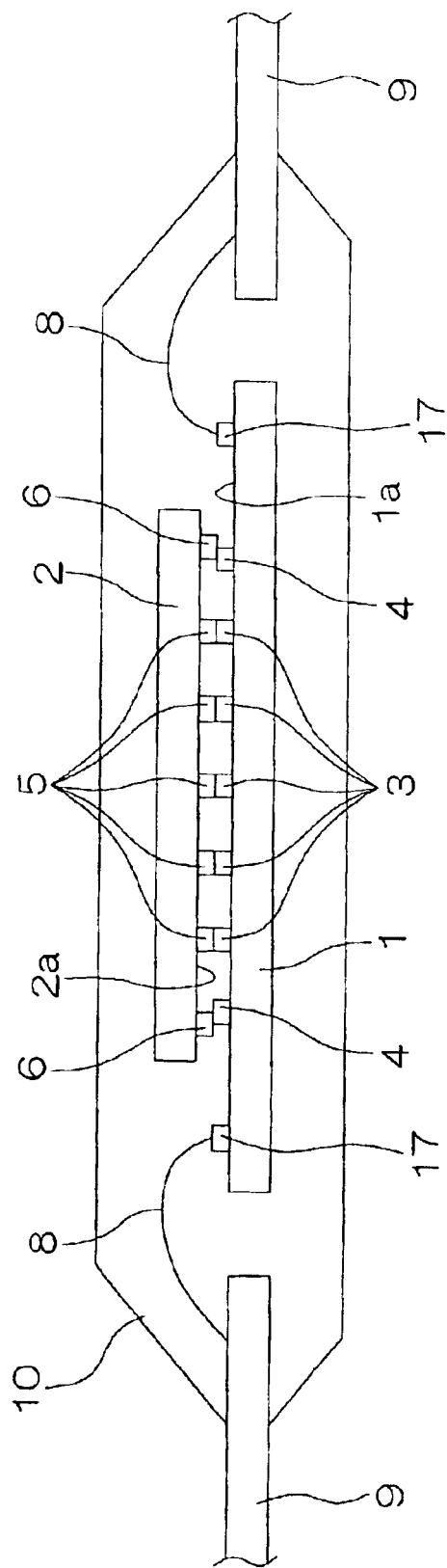
FIG. 1 is an illustrative sectional view of a semiconductor device according to a first embodiment of the present invention.

FIG. 1 is an illustrative sectional view of a semiconductor device according to a first embodiment of the present invention.

The semiconductor device has, what is called, a chip-on-chip structure having a parent chip 1, or first semiconductor chip, superposed and bonded thereon with a child chip 2, or second semiconductor chip. The child chip 2, smaller than the parent chip 1, is arranged nearly at a center of the parent chip 1.

The parent chip 1 and the child chip 2 respectively have active surfaces 1a, 2a forming functional elements and wirings on the opposed surfaces thereof. On the active surface 1a of the parent chip 1, there are provided internal connection electrodes 3 and lateral-deviation confirming electrodes 4. The internal connection electrodes 3 and the lateral-deviation confirming electrodes 4 are formed as bumps projecting from the active surface 1a. External-extension electrodes 17 are provided in a position close to a peripheral edge of the active surface 1a and where the active surface 2a is not opposed.

On the active surface 2a of the child chip 2, there are provided internal connection electrodes 5 in positions corresponding to the internal connection electrodes 3 and lateral-deviation confirming electrodes 6 in positions nearly corresponding to the lateral-deviation confirming electrodes 4. The internal connection electrodes 5 and the lateral-deviation confirming electrodes 6 are formed as bumps projecting from the active surface 2a. Connection is made between the internal connection electrodes 3 and the internal connection electrodes 5 as well as between the lateral-deviation confirming electrodes 4 and the lateral-deviation confirming electrodes 6.

A leadframe 9 is arranged laterally of the parent chip 1 to extend sideways with a spacing from the parent chip 1. The external-extension electrodes 17 are connected to the leadframe 9 by bonding wires 8. The parent chip 1, the child chip 2, the bonding wires 8 and the region including the connection part between the bonding wires 8 and the leadframe 9 are molded and protected with a sealing resin 10.

Figure 2B:
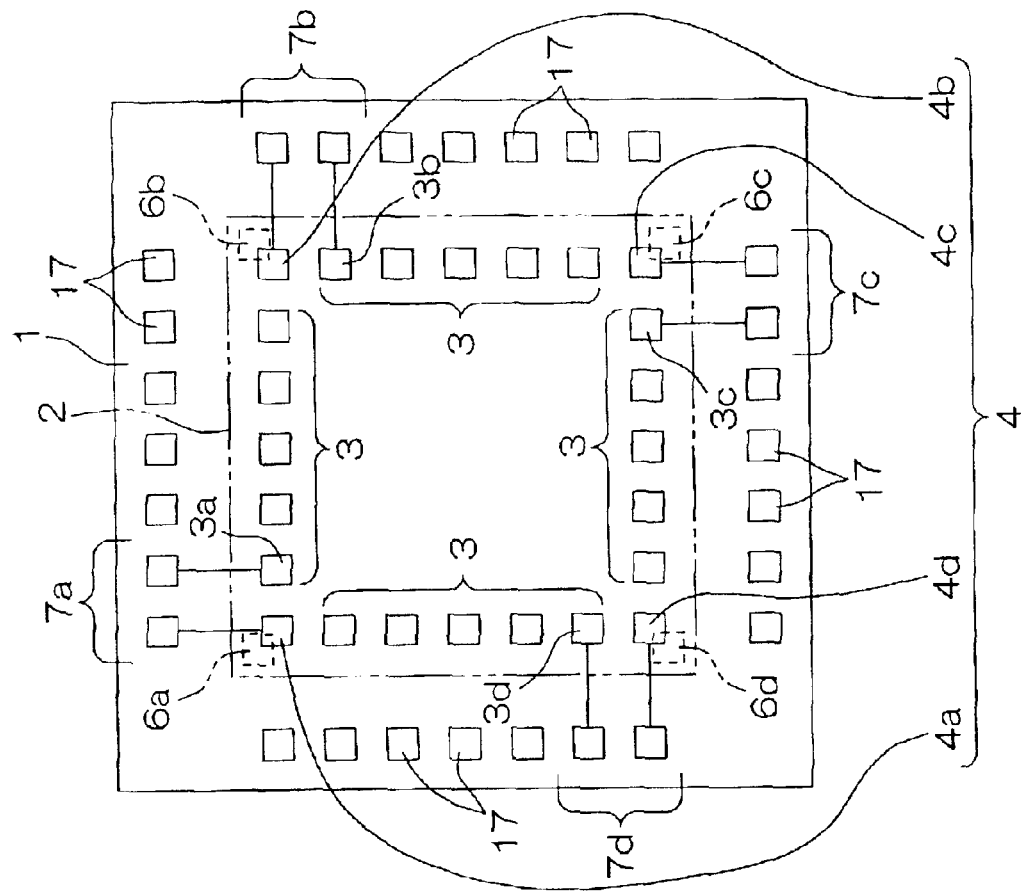
FIGS. 2A and 2B are illustrative plan view showing an arrangement of internal connection electrodes and lateral-deviation confirming electrodes on the semiconductor device of FIG. 1.
Figure 2A:
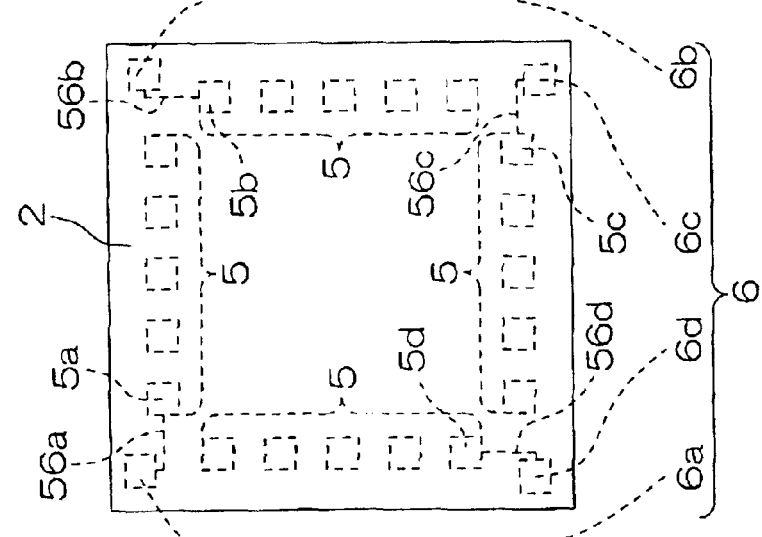

FIGS. 2A and 2B are illustrative plan views depicting an arrangement of the internal connection electrodes 3, 5 and lateral-deviation confirming electrodes 4, 6. FIG. 2A shows an arrangement of the internal connection electrodes 5 and lateral-deviation confirming electrodes 6 on the child chip 2 while FIG. 2B shows an arrangement of the internal connection electrodes 3 and lateral-deviation confirming electrodes 4 on the parent chip 1.

The parent chip 1 and the child chip 2 are each have a rectangular shape (nearly square) in plan view. The internal connection electrodes 5 are arranged along the four sides of the child chip 2 in positions close to the peripheral edge of the child chip 2. The lateral-deviation confirming electrodes 6 include four lateral-deviation confirming electrodes 6a–6d which are arranged close to the respective four corners of the child chip 4. Namely, the lateral-deviation confirming electrodes 6a–6d are arranged spaced from one another. The lateral-deviation confirming electrodes 6a–6d are arranged closer to the peripheral edge as compared to the internal connection electrodes 5 of the child chip 2. The lateral-deviation confirming electrodes 6a–6d are respectively connected to the adjacent internal connection electrodes 5a–5d through wirings 56a, 56b, 56c, 56d.

The internal connection electrodes 3 and the lateral-deviation confirming electrodes 4 are arranged on the parent chip 1, in positions respectively corresponding to the internal connection electrodes 5 and the lateral-deviation confirming electrodes 6. The lateral-deviation confirming electrodes 4 includes four lateral-deviation confirming electrodes 4a–4d respectively corresponding to the lateral-deviation confirming electrodes 6a–6d. The internal connection electrodes 3 are arranged nearly at an equal interval in positions inward nearly by an equal distance from the peripheral edge of the parent chip 1.

The internal connection electrodes 3, 5 and the lateral-deviation confirming electrodes 4, 6 have all the same shape (almost square in plan view) and the same size.

When the child chip 2 is arranged in a predetermined position (shown by the two-dot chain line in FIG. 2B) on the parent chip 1, the internal connection electrodes 3 and the internal connection electrodes 5 are nearly perfectly overlapped in position in plan view. At this time, the lateral-deviation confirming electrodes 6a–6d are overlapped deviated in position with the lateral-deviation confirming electrodes 4a–4d as shown by the two-dot chain line in FIG. 2B. The lateral-deviation confirming electrodes 6a–6d are arranged in positions closer to the peripheral edge on the child chip 2 relative to the lateral-deviation confirming electrodes 4a–4d, within a range to keep connection. Provided that the lateral-deviation confirming electrode 4a–4d, 6a–6d has a width (one-side length) of Lb, the lateral-deviation confirming electrodes 4a–4d and the lateral-deviation confirming electrodes 6a–6d have such a deviation that there is an overlap of Lb/3 in a direction along the sides in pair of the relevant electrode and the orthogonal direction along the other paired sides. Namely, the lateral-deviation confirming electrode 4a–4d and the lateral-deviation confirming electrode 6a–6d are overlapped together with an area of one-ninth of the electrode area.

The lateral-deviation confirming electrode 4a–4d and the internal connection electrode 3a–3d corresponding to the internal connection electrode 5a–5d are respectively connected to the conduction confirming electrodes 7a–7d in a pair arranged close to the peripheral edge on the parent chip 1. Namely, the lateral-deviation confirming electrode 4a–4d is connected to one of the electrodes constituting a pair of conduction confirming electrodes 7a–7d while the internal connection electrode 3a–3d is connected to the other of the electrodes constituting the paired conduction confirming electrodes 7a–7d.

According to the above structure, in the case where the child chip 2 is arranged in a predetermined position on the parent chip 1, a circuit is formed extending from one of the paired conduction confirming electrodes 7a–7d to the other of the pair of conduction confirming electrodes 7a–7d through the lateral-deviation confirming electrode 4a–4d, the lateral-deviation confirming electrode 6a–6d, the internal connection electrode 5a–5d and the internal connection electrode 3a–3d. Namely, a short circuit state is to be provided between the two electrodes constituting the conduction confirming electrode pair 7a–7d. Accordingly, by examining a presence or absence of electrical conduction between the conduction confirming electrode pairs 7a–7d, it is possible to know whether or not there is a contact between the lateral-deviation confirming electrode 4a–4d and the lateral-deviation confirming electrode 6a–6d.

The conduction confirming electrode pair 7a–7d is preferably confirmed for conduction during an intermediate test to be conducted prior to resin molding with a sealing resin 10 (more preferably, prior to wire bonding).

The electrode of the conduction confirming electrode pair 7a–7d connected to the lateral-deviation confirming electrode 6a–6d can be made not connected to the leadframe 9, for use only in confirming an electrical conduction in the intermediate test. In this case, in a semiconductor device in the final form, there is no formation of a circuit including the two electrodes constituting the conduction confirming electrode pair 7a–7d. Accordingly, the internal connection electrodes 3a–3d and 5a–5d can be used as usual internal connection electrodes 3, 5. Also, the electrode of the conduction confirming electrode pair 7a–7d connected to the internal connection electrode 3a–3d can be used as an external extension electrode 17.

Figure 3A:
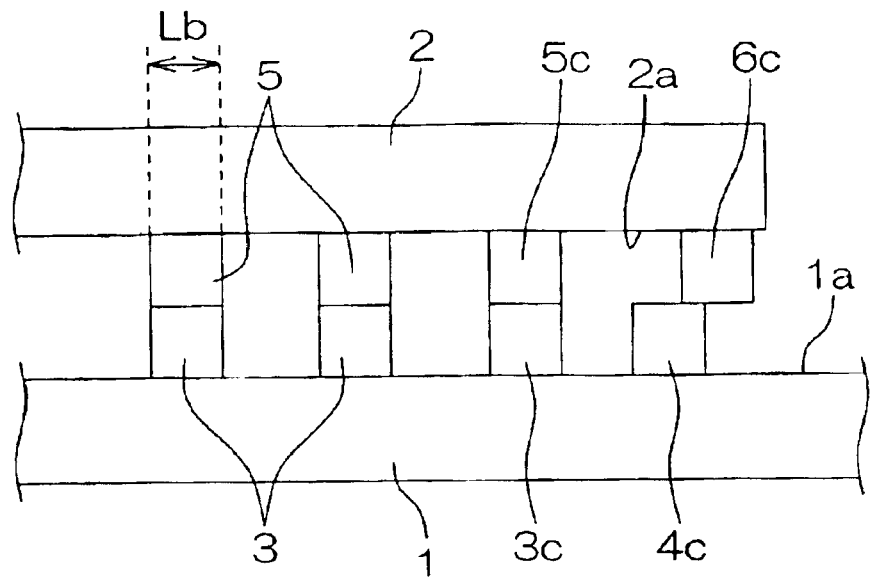
FIGS. 3A and 3B are illustrative side views showing a connection state of between parent and child chips in the semiconductor device of FIG. 1.
Figure 3B:
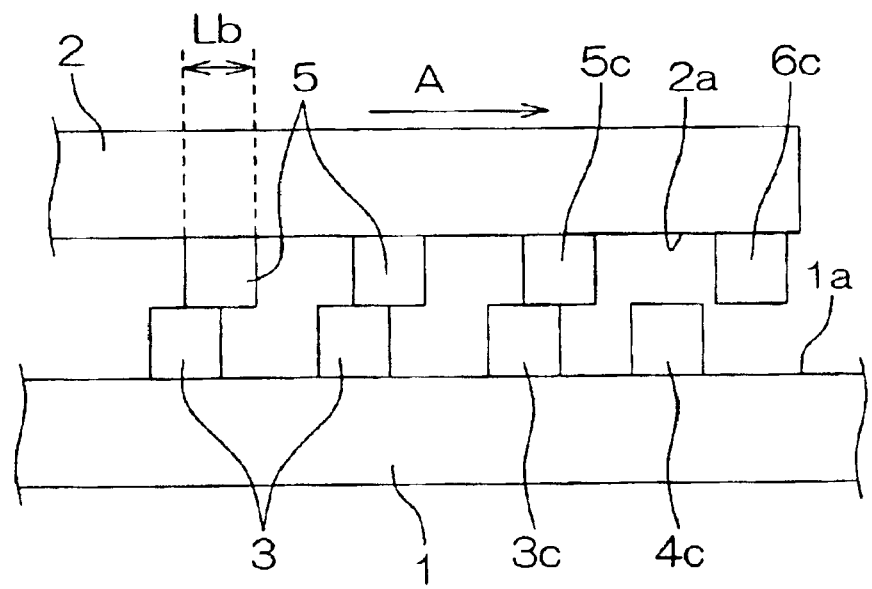

FIGS. 3A and 3B are illustrative side views depicting a connection state of between the parent chip 1 and the child chip 2. FIGS. 3A and 3B are views of the parent chip 1 and child chip 2 seen from a side on which the lateral-deviation confirming electrodes 4c, 4d, 6c, 6d are arranged, showing a vicinity of the lateral-deviation confirming electrodes 4c, 6c.

FIG. 3A shows a state in which the child chip 2 is arranged, in a predetermined proper position on the parent chip 1. In this case, the internal connection electrodes 3, 5 are aligned with each other in an on-plane direction of the active surface 1a, 2a whereas the lateral-deviation confirming electrodes 4c, 6c are deviated in position from each other. The internal connection electrode 3 and the internal connection electrode 5 has a connection having a width nearly equal to a width L of the internal connection electrode 3, 5 and lateral-deviation confirming electrode 4, 6 formed as a bump (hereinafter, referred to as "electrode width Lb"). The lateral-deviation confirming electrode 4c and the lateral-deviation confirming electrode 6c have a junction having a width that is nearly one-third of the electrode width Lb. The electrode width Lb can be given 20 μm, for example.

FIG. 3B shows a state in which the child chip 2 is arranged deviated relative to the parent chip 1 by a distance of a half of the electrode width Lb in a direction where the lateral-deviation confirming electrodes 6b, 6c are arranged as viewed from a center of the child chip 2 (in a direction of arrow A).

The internal connection electrode 3 and the internal connection electrode 5 have a junction having a width that is a half of the electrode width Lb. There is no contact between the lateral-deviation confirming electrode 4c and the lateral-deviation confirming electrode 6c. Accordingly, in such a case, electrical conduction is not available in the conduction confirming electrode pair 7c.

A junction is provided between the internal connection electrode 3 and the internal connection electrode 5, to provide an electrical conduction between them. Moreover, because the junction is not extremely (e.g. extraordinary) narrowed in width with respect to the electrode width Lb, the region including the junction between the internal connection electrode 3 and the internal connection electrode 5 has an electric resistance not greatly different as compared to that with a proper connection (FIG. 3A). For this reason, the conventional test on an electric method would determine that the internal connection electrode 3 and the internal connection electrode 5 are in a normal connection.

However, in such a case as in the state of FIG. 3B, despite the connection is electrically normal, mechanical strength is insufficient because of a small junction area of between the internal connection electrode 3 and the internal connection electrode 5. Consequently, there is a fear to cause a fracture in the junction even when a slight amount of load is applied. Accordingly, a semiconductor device in such a state must be determined unacceptable.

In the semiconductor device of this embodiment, by examining a presence or absence of electrical conduction between the internal connection electrode 4c and the lateral-deviation confirming electrode 6c, determination is possible as to whether connection is mechanically made with sufficient strength in addition to whether electrical connection is provided or not between the internal connection electrode 3 and the internal connection electrode 5. Namely, in the case where a conduction is available between the lateral-deviation confirming electrodes 4c, 6c, it can be seen that the internal connection electrode 5 is not deviated by a distance of one-third or more of the electrode width Lb in the direction of arrow A relative to the internal connection electrode 3. It is, accordingly, determined that there is no poor junction strength and electrical connection on the internal connection electrode 5 with the internal connection electrode 3 due to a deviation in the direction of arrow A (proper internal connection is proper).

On the other hand, in the case where conduction is not available between the lateral-deviation confirming electrodes 4c, 6c, it can be seen that the internal connection electrode 5 is deviated relative to the internal connection electrode 3 by a distance of one-third or more of the electrode width Lb in the direction of arrow A. In this case, it is determined that there is a poor junction strength or electrical connection (in a state connection is not made) on the internal connection electrode 5 with the internal connection electrode 5 due to a deviation in the direction of arrow A. Because the semiconductor device having any of the abnormalities is unacceptable, there is no need to distinguish between the both.

The above is on the case where the child chip 2 deviates in the arrow-A direction relative to the parent chip 1 (FIG. 3B), wherein electric conductance is not available similarly between the lateral-deviation confirming electrode 4b and the lateral-deviation confirming electrode 6b. In the case where the child chip 2 deviates relative to the parent chip 1 by a distance of one-third or more of the electrode width Lb in the direction opposite to the arrow A, electrical conduction is not available between the lateral-deviation confirming electrode 4a, 4d and the lateral-deviation confirming electrode 6a, 6d.

Similarly, in the case where the child chip 2 deviates relative to the parent chip 1 by a distance of one-third or more of the electrode width Lb toward this side in the direction perpendicular to the page of FIGS. 3A and 3B, electrical conduction is not available between the lateral-deviation confirming electrode 4c, 4d and the lateral-deviation confirming electrode 6c, 6d. When the child chip 2 deviates relative to the parent chip 1 away from this side in the direction perpendicular to the page of FIGS. 3A and 3B, electrical conduction is not available between the lateral-deviation confirming electrode 4a, 4b and the lateral-deviation confirming electrode 6a, 6b.

Meanwhile, in the case where the child chip 2 rotatively deviates on a plane of the active surface 2a besides a deviation with a parallel movement from a predetermined proper position over the parent chip 1, electrical conduction is not available between any of the sets of the lateral-deviation confirming electrodes 4a–4d, 6a–6d. Namely, in the case where the child chip 2 deviates relative to the parent chip 1 in any way on the plane of the active surface 1a, 2a, it is possible to determine whether the internal connection is proper or not by examining the electrical conduction between the lateral-deviation confirming electrodes 4a–4d, 6a–6d. Meanwhile, testing can be simply conducted because of four sets of lateral-deviation confirming electrodes 4, 6 required for examining a presence or absence of electrical conduction.

As the deviation increases between the internal connection electrode 3 and the internal connection electrode 5, the junction area of between them decreases to decrease mechanical strength. Depending upon whether the mechanical strength decreases lower than a permissible level at what degree the deviation is, it is possible to desirably set a relative positional relationship between the lateral-deviation confirming electrode 4a–4d and the lateral-deviation confirming electrode 6a–6d. For example, when the internal connection electrodes 3, 5 are connected with each other with a slight deviation but the strength at the junction thereof is at a permissible level or lower, it is possible to provide an arrangement without contact in spite of a slight deviation mutually between the lateral-deviation confirming electrode 4a–4d, 6a–6d.

Figure 4B:
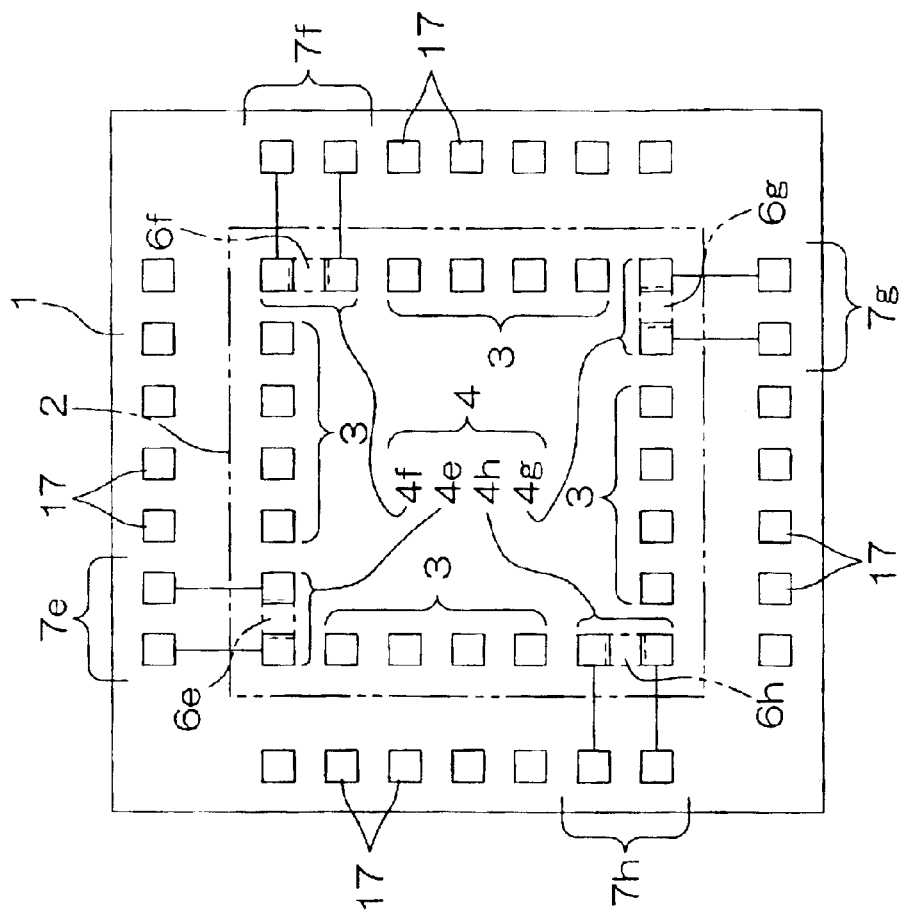
FIGS. 4A and 4B are illustrative plan view showing an arrangement of internal connection electrodes and lateral-deviation confirming electrodes on a semiconductor device according to a second embodiment of the invention.
Figure 4A:
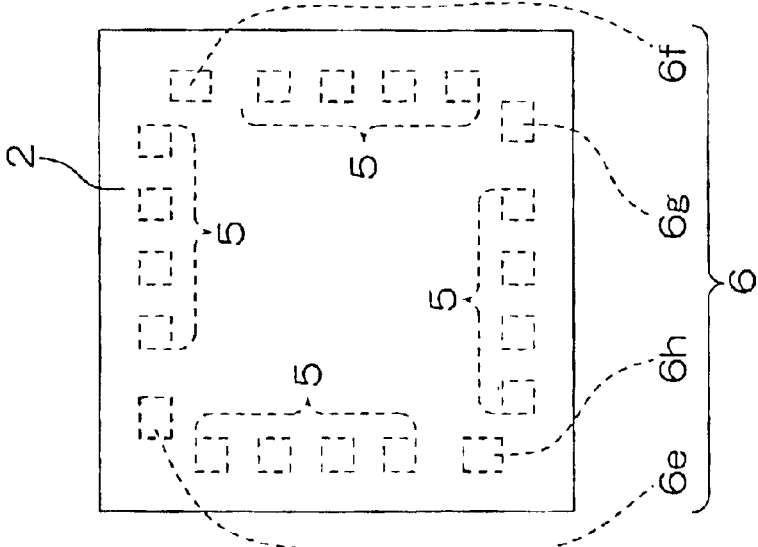

FIGS. 4A and 4B are illustrative plan views depicting an arrangement of the internal connection electrodes and lateral-deviation confirming electrodes on a semiconductor device according to a second embodiment of the invention. The same constituent elements as the constituent elements shown in FIGS. 2A and 2B are attached with the same references to omit the explanations thereof. FIG. 4A shows an arrangement of the internal connection electrodes 5 and lateral-deviation confirming electrodes 6 on the child chip 2 while FIG. 4B shows an arrangement of the internal connection electrodes 3 and lateral-deviation confirming electrodes 4 on the parent chip 1.

The lateral-deviation confirming electrodes 6 include four shorting wirings 6e–6h. The shorting wirings 6e–6h are arranged close to the respective four corners of the child chip 2. Namely, the shorting wiring 6e–6h is arranged spaced from one another. The shorting wirings 6e–6h each in a square form in plan view, having a pair of sides having a length equal to the electrode width Lb and the other pair of sides having a length longer than the electrode width Lb.

The shorting electrode 6e, in the longitudinal direction, is parallel with one side of the child chip 4. The shorting electrode 6f in the longitudinal direction is provided parallel with a side adjacent to that side. Furthermore, the shorting electrode 6g in the longitudinal direction is provided parallel with a side adjacent to that. Furthermore, the shorting electrode 6h in the longitudinal direction is provided parallel with a side adjacent to that. Consequently, the shorting electrodes 6e, 6g positioned at the diagonal corners in one pair on the child chip 4 are in parallel with each other in the longitudinal direction. The shorting electrodes 6f, 6h positioned at the diagonal corners in the other pair are in parallel with each other in the longitudinal direction. Thus, the shorting electrode 6e, 6g in the longitudinal direction and the shorting electrode 6f, 6h in the longitudinal direction are nearly in an orthogonal relationship.

Lateral-deviation confirming electrodes 4 are formed on the child chip 1. The lateral-deviation confirming electrodes 4 include four pairs of connection confirming electrodes 4c–4h corresponding to the shorting wirings 6e–6h. Each connection confirming electrode pair 4e–4h includes two electrodes provided close to each other. The two electrodes are arranged along the longitudinal direction of the corresponding shorting wiring 6e–6h.

The electrodes constituting the connection confirming electrode pair 4e and the electrodes constituting the connection confirming electrode pair 4g are arranged in a direction along one pair of opposite sides of the parent chip 1. The electrodes constituting the connection confirming electrode pair 4f and the electrodes constituting the connection confirming electrode pair 4h are arranged in a direction along the other pair of opposite sides of the parent chip 1.

When the child chip 2 is arranged in a predetermined proper position on the parent chip 1 (shown by two-dot chain line in FIG. 4B), the connection confirming electrode pairs 4e–4h are respectively shorted by the shorting wirings 6e–6h (shown by two-dot chain line in FIG. 4B). The two electrodes constituting each connection confirming electrode pair 4e–4h are in a state of insulation from each other when the shoring wiring 6e–6h is out of connection (contact).

The connection confirming electrode pairs 4e–4h are respectively connected to the conduction confirming electrode pairs 7e–7h arranged close to the peripheral edge on the parent chip 1.

Figure 5A:
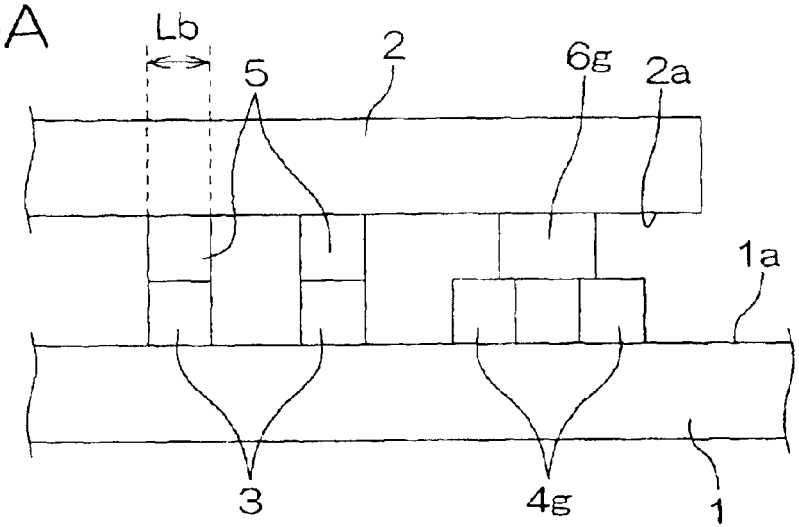
FIGS. 5A, 5B and 5C are illustrative side views showing a connection state of between parent and child chips of FIGS. 4A and 4B.
Figure 5B:
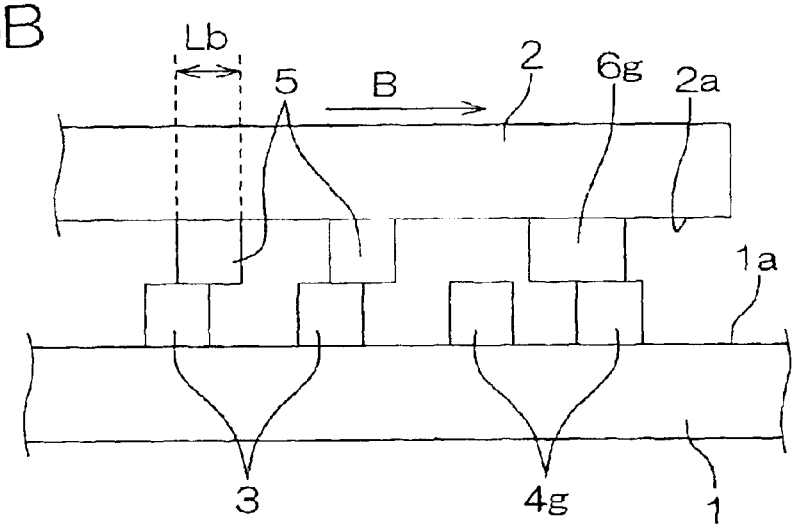
Figure 5C:
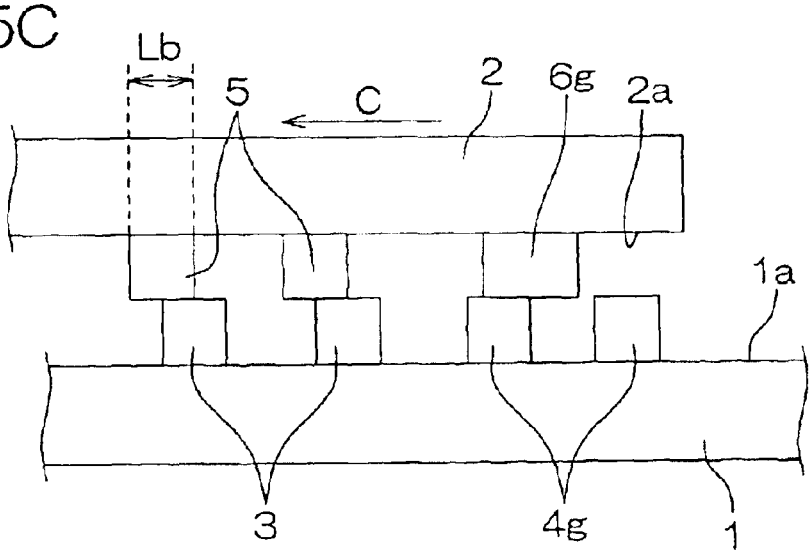

FIGS. 5A–5C are illustrative side views depicting a connection state of the parent chip 1 and child chip 2 shown in FIGS. 4A and 4B. FIGS. 5A–5C are views of the parent chip 1 and child chip 2 seen at a side arranged with the connection confirming electrodes 4g, 4h and shorting wirings 6g, 6h, showing a vicinity of the connection confirming electrode pair 4g and shorting wiring 6g.

When the child chip 2 is arranged in a predetermined proper position on the parent chip 1 (FIG. 5A), the internal connection electrodes 3 and the internal connection electrodes 5 are aligned in an on-plane direction of the active surface 1a, 2a. The two electrodes constituting the connection confirming electrode pair 4g are both in contact (connection) with the short wiring 6g, to provide an electrical shorting at between them. The shorting wiring 6g has a width slightly grater than a distance between the two electrodes constituting the connection confirming electrode pair 4g. The two electrodes constituting the connection confirming electrode pair 4g are both in contact (connection) with the shorting wiring 6g by a width of approximately one-third of the electrode width Lb.

FIG. 5B shows a state in which the child chip 2 deviates relative to the parent chip 1 by a distance of nearly a half of the electrode width Lb, in a direction where the shorting wirings 6f, 6g are arranged as viewed from a center of the parent chip 1 (in a direction of arrow B).

The internal connection electrode 3 and the internal connection electrode 5 have a junction having a width of approximately half of the electrode width Lb. The shorting wiring 6g is connected to one of the electrodes constituting the connection confirming electrode pair 4g (at the outer side on the parent chip 1) but not connected to the other of the electrodes constituting the connection confirming electrode pair 4g (at the inner side on the parent chip 1). Accordingly, in such a case, electrical conduction is not available in the conduction confirming electrode pair 7g.

FIG. 5C shows a state in which the child chip 2 deviates relative to the parent chip 1 by a distance of nearly a half of the electrode width Lb, in a direction where the shorting wirings 6e, 6h are arranged as viewed from a center of the parent chip 1 (in a direction of arrow C).

The internal connection electrode 3 and the internal connection electrode 5 have a junction having a width of approximately a half of the electrode width Lb. The shorting wiring 6g is connected to one of the electrodes constituting the connection confirming electrode pair 4g (at the inner side on the parent chip 1) but not connected to the other of the electrodes constituting the connection confirming electrode pair 4g (at the outer side on the parent chip 1). Accordingly, in such a case, electrical conduction is not available either in the conduction confirming electrode pair 7g.

In this manner, in this embodiment, it is possible to know a poor internal connection resulting from a deviation in an opposite direction to each other (in directions of arrows B and C) by the use of a set of shorting wiring 6g and connection confirming electrode pair 4g.

In the case where the child chip 2 deviates in the direction of arrow B or C, electrical conduction is not available either between the connection confirming electrode pair 4e and the shorting wiring 6e (in the conduction confirming electrode pair 7e). In the case where the child chip 2 deviates in the direction perpendicular to the page of FIGS. 5A–5C (in a direction toward or away from this side), electrical conduction is not available either between the connection confirming electrode pair 4f, 4h and the shorting wiring 6f, 6h (in the conduction confirming electrode pair 7f, 7h). Meanwhile, in the case where the child chip 2 rotatively deviates on the active surface 2a besides the deviation with a parallel movement from a predetermined proper position over the parent chip 1, conduction is not available between any of the connection confirming electrode pairs 4e–4h and the shorting wiring 6e–6h.

Accordingly, in also this embodiment, in case where the child chip 2 deviates relative to the parent chip 1 in any way on the plane of the active surface 1a, 2a, it is possible to determine an abnormality of internal connection by examining an electrical conduction between the connection confirming electrode pair 4e–4h and the shorting wiring 6e–6h.

It is preferred to confirm an electrical conduction between the connection confirming electrode pair 4e–4h and the shoring wiring 6e–6h in an intermediate test to be conducted prior to molding with a sealing resin 10 (more preferably, prior to wire bonding).

The number of confirming electrodes 4, 6 may not be 4 sets per one set of parent chip 1 and child chip 2, i.e. may be 3 sets or less or 5 sets or more. For example, in the semiconductor device of the first embodiment, the lateral-deviation confirming electrodes 4, 6 may merely include the lateral-deviation confirming electrodes 4a, 4c and lateral-deviation confirming electrodes 6a, 6c provided close to diagonal corners in one pair. In this case, it is possible to know an abnormality of internal connection due to a deviation in any direction on the plane of the active surface 1a, 2a.

Meanwhile, where there is no need to know an abnormality of internal connection concerning a deviation in every direction on the active surface 1a, 2a, the number of lateral-deviation confirming electrodes 4, 6 may be one set, for example. In this manner, it is possible to desirably determine the number of lateral-deviation confirming electrodes 4, 6 depending upon the purpose or determination accuracy required.

The lateral-deviation confirming electrode 6 may not be arranged at or around a corner of the child chip 2, e.g. may be arranged in a position facing a center of a side of the chip 2. Depending upon a position of the lateral-deviation confirming electrode 6, the lateral-deviation confirming electrode 4 can be arranged at a suited position on the parent chip 1.

Figure 6B:
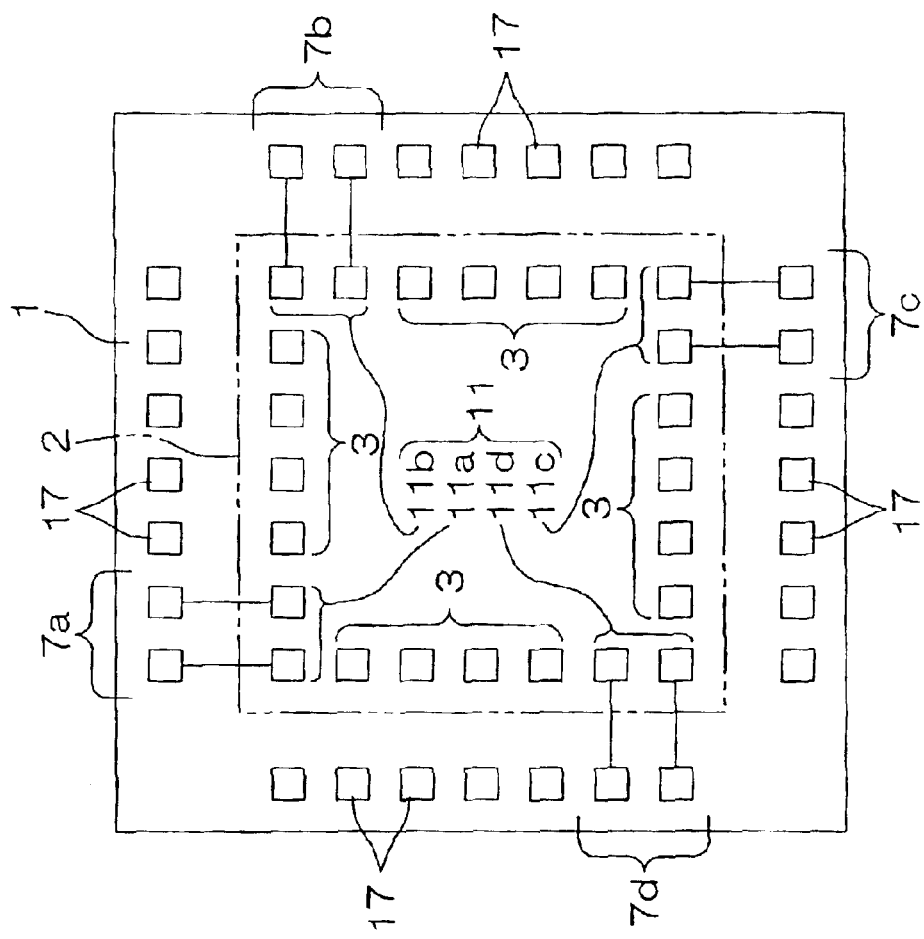
FIGS. 6A and 6B are illustrative plan view showing an arrangement of electrodes on a semiconductor device according to a third embodiment of the invention.
Figure 6A:
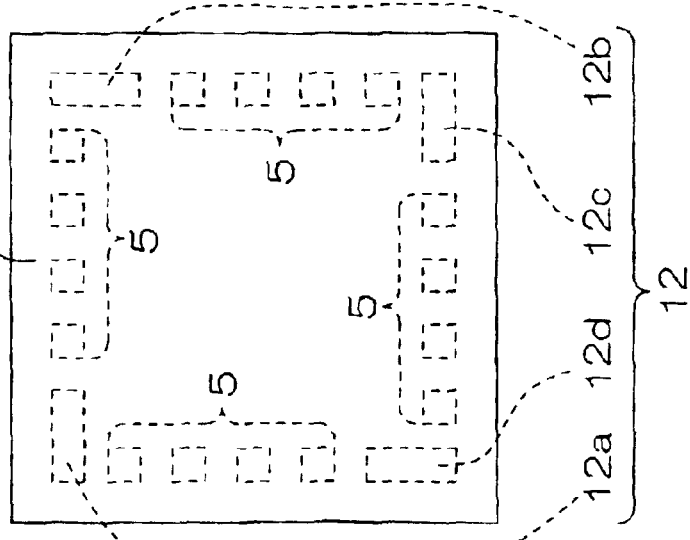

FIGS. 6A and 6B are illustrative plan views depicting an arrangement of electrodes on a semiconductor device according to a third embodiment of the invention. FIG. 6A shows an arrangement of electrodes on the parent chip 1 while FIG. 6B shows an arrangement of electrodes on the child chip 2. The same constituent elements as the constituent elements shown in FIGS. 2A and 2B are attached with the same references in FIGS. 6A and 6B to omit the explanations thereof.

The child chip 2 is arranged with internal connection electrodes 5 and reference-height electrodes 12. The reference-height electrodes 12 include four reference-height electrodes 12a–12d. The reference height electrodes 12a–12d, each having a rectangular form in plan view, are arranged in positions close to the respective four corners of the child chip 2. The reference-height electrode 12a–12d, in the longitudinal direction, is along an adjacent side of the child chip 2. The reference-height electrodes 12a, 12c, positioned at one pair of diagonal regions on the child chip 2, are parallel with each other in the longitudinal direction. The reference-height electrodes 12b, 12d, positioned at the other pair of diagonal regions on the child chip 2, are also parallel with each other in the longitudinal direction. The reference-height electrode 12a, 12c and the reference-height electrode 12b, 12d are nearly orthogonal to each other in the longitudinal direction.

On the parent chip 1, there are arranged internal connection electrodes 3 and reference-height electrodes 11 in a manner respectively corresponding to the internal connection electrodes 5 and reference-height electrodes 12. The reference-height electrodes 11 include mutually-spaced reference-height electrodes 11a–11d in four pairs corresponding to the reference-height electrodes 12a–12d. Each reference-height electrode pair 11a–11d includes two electrodes in positions close to each other, which electrodes are arranged at both ends of the reference-height electrode 12a–12d.

When the internal connection electrodes 3, 5 are connected together in a predetermined relative position (proper position), the reference-height electrode pairs 11a–11d position in a distribution region of the reference-height electrodes 12a–12d in plan view. The reference-height electrode pairs 11a–11d are respectively connected to the conduction confirming electrode pairs 7a–7d arranged in a peripheral region on the parent chip 1.

FIGS. 7A–7D are illustrative side views depicting a connection state of the parent chip 1 and child chip 2 of FIGS. 6A and 6B. FIGS. 7A–7D are views of the parent chip 1 and child chip 2 at a side arranged with the reference-height electrodes 11c, 11d and reference-height electrodes 12c, 12d, showing a vicinity of the reference-height electrodes 11c and reference-height electrodes 12c.

The internal connection electrodes 3 and the internal connection electrodes 5 are formed as bumps projecting from the respective active surfaces 1a, 2a. The internal connection electrodes 3, 5 are not constant in height to have variations. The reference-height electrodes 11 (reference-height electrode pairs 11a–11d) are also formed as bumps projecting from the active surface 1a. The reference-height electrodes 11 has a height lower than the lowest one of the internal connection electrodes 3.

Specifically, in the case where the internal connection electrodes 3 have a height with mean value a1 and standard deviation σ1, the reference height electrodes 11 are adjusted in height to a1-3σ1.

Similarly, the reference-height electrodes 12 are formed as bump projecting from the active surface 2a. These have a height adjusted to a2-3σ2 on the basis of the mean value a2 and standard deviation σ2 of the internal connection electrodes 5. In FIGS. 7A–7D, the internal connection electrodes 5e, 5f and reference-height electrode 12c are all shown in the same height.

Herein, the mean value a1, a2 and the standard deviation σ1, σ2 are those not determined on each chip 1, 2 but previously determined on the basis of the data as measured on some parent chips 1 and child chips 2. These values are constantly applied onto all the parent chips 1 and all the child chips 2.

In case the height of the reference-height electrode 11 is fixed as above, when the internal connection electrodes 3 are small in the number, the reference-height electrode 11 is lower in height than every internal connection electrode 3 on almost all the parent chips 1. Also, in case the height of the reference-height electrode 12 is fixed as above, when the internal connection electrodes 5 are sufficiently small in the number, the reference-height electrode 12 is lower in height than every internal connection electrode 5 on almost all the child chips 2. Due to this, the sum of a height of the reference-height electrode 11 and a height of the reference-height electrode 12, in almost cases, is smaller than the minimal one of the sums of a height of the internal connection electrode 3 and a height of the corresponding internal connection electrode 5.

The internal connection electrodes 3, 5 and the reference height electrodes 11, 12 can be formed by a method of plating or the like. In this case, variations in height occur among the internal connection electrodes 3, 5 due to a difference in growth (forming) rate. The magnitude of variations is approximately 2 $\mu$m at 6σ1 or 6σ2, for example.

The internal connection electrodes 3, 5 can be formed higher than the reference height electrode 11, 12 by a growth for a longer time than the reference height electrode 11, 12. Namely, the internal connection electrodes 3, 5 only are first grown to respective mean heights of 3σ1 and 3σ2. At this time, a mask is formed in a region to form the reference height electrode 11, 12 on the active surface 1a, 2a, not to grow the reference height electrode 11, 12. Then, the mask is removed away. Next, the internal connection electrodes 3 and reference height electrode 11 are simultaneously grown by a mean growth height of a1-3σ1. Also, the internal connection electrodes 5 and the reference height electrode 12 are simultaneously grown by a mean growth height of a2-3σ2. This provides the internal connection electrodes 3, 5 with respective mean heights of a1, a2 and the reference height electrodes 11, 12 with respective heights of a1-3σ1, a2-3σ2.

Meanwhile, the region of the active surface 1a, 2a forming the reference height electrode 11, 12 may be formed lower than the region of the active surface 1a, 2a forming the internal connection electrodes 3, 5 (e.g. as a recess provided in a planar active surface 1a, 2a). In this case, the internal connection electrodes 3 and the reference height electrode 11 are simultaneously grown by the same height, whereby the reference height electrode 11 is made lower than the internal connection electrodes 3. Meanwhile, by simultaneously growing the internal connection electrodes 5 and the reference height electrode 12 by the same height, the reference height electrode 12 is made lower than the internal connection electrodes 5.

Because the reference height electrode 11 and the reference height electrode 12 must be correctly made to a predetermined height, fine adjustment may be made by etching or the like after being formed by the method of plating or the like.

In the manufacture of a semiconductor device, when the internal connection electrodes 3, 5 are connected with each other, the parent chip 1 and the child chip are first opposed such that the active surfaces 1a, 2a are parallel with each other. Then, the active surfaces 1a, 2a are aligned in an on-plane direction such that the internal connection electrodes 3, 5, at the corresponding ones, are in a predetermined relative position (FIG. 7A). At this time, the spacing between the internal connection electrodes 3, 5 is narrow in the set greater in the sum H3+H5 of the height H3 of internal connection electrode 3 and the eight H5 of internal connection electrode 5 and broad in the set smaller in the sum H3+H5 of the height H3 and the height H5.

Subsequently, as the active surface 1a and the active surfaces 2a are approached, contact is made between the internal connection electrodes 3e, 5e in the set having the greatest sum H3+H5 of the height H3 and the height H5 (FIG. 7B) Furthermore, as the active surface 1a and the active surface 2a are approached by pressurization, the internal connection electrodes 3e, 5e are crushed and connected together. The internal connection electrodes 3, 5 in the sets, are brought into contact and connected with each other in the order greater in the sum H3+H5 of the height H and the height H5. Thus, the internal connection electrodes 3f, 5f in the set having the smallest sum H3+H5 of the height H and the height H5, are crushed and connected together (FIG. 7C).

Furthermore, as the active surface 1a and the active surface 2a are approached by pressurization, contact is made between the reference height electrode pairs 11a–11d and the reference height electrodes 12a–12d (FIG. 7D). In the case where the pressurizing force is set in a magnitude needed to connect (contact) between the internal connection electrodes 3, 5 having the height deviation ±3σ1, 3σ2, connection is ended in this state.

Accordingly, by confirming the contacts of between the reference height electrode pair 11a–11d and the reference height electrodes 12a–12d, it is possible to determine that the internal connection electrodes 3, 5 in all the sets are connected. It is possible to determine whether there is a contact between the reference height electrode pair 11a–11d and reference height electrodes 12a–12d, by examining whether there is an electrical conduction in the conduction confirming electrode pair 7a–7d.

It is preferred to confirm a conduction on the conduction confirming electrode pair 7a–7d during an intermediate test to be conducted prior to molding with a sealing resin 10 (more preferably, prior to wire bonding).

In a state where there is an electrical conduction between the conductive confirming electrode pairs 7a–7d, the internal connection electrodes 3, 5 in all the sets are in electrical connection. Meanwhile, in the case where the sum in height of the reference height electrodes 11, 12 is sufficiently small as compared to the sum in height of the internal connection electrodes 3f, 5f, the internal connection electrodes 3f, 5f are connected together at a sufficiently great mechanical strength. Where the internal connection electrodes 3, 5 are small in the number, there is a high probability that the sum in height of the reference height electrodes 11, 12 is sufficiently small as compared to the sum in height of the internal connection electrodes 3f, 5f (the minimum one in the height sum H3+H5). In this case, the other internal connection electrodes 3, 5 are naturally connected together at a sufficiently great mechanical strength. Accordingly, such a semiconductor device is to be determined acceptable.

In the case where the sum in height of the reference height electrodes 11, 12 is merely, slightly smaller as compared to the sum in height of the internal connection electrodes 3f, 5f, there is a possibility that a small number of sets of internal connection electrodes 3, 5 including the internal connection electrodes 3f, 5f have a junction strength not sufficiently great. In even this case, the semiconductor device is determined acceptable in the above determining method. However, in case the internal connection electrodes 3, 5 in the major set shave a junction having a sufficient high mechanical strength, the mechanical strength as a whole is sufficiently great and hence the semiconductor device may be determined acceptable.

On the other hand, in case there is no electrical conduction in the conduction confirming electrode pairs 7a–7d and no contacts are confirmed respectively between the reference height electrode pairs 11a–11d and the reference height electrode pairs 12a–12d, there is a possibility of no connection at between the internal connection electrodes 3, 5 in any set, as shown in FIG. 7B. Meanwhile, even where all the sets of the internal connection electrodes 3, 5 are in electrical connection as shown in FIG. 7C, there is a possibility that there exist many sets of internal connection electrodes 3, 5 (internal connection electrodes 3f, 5f, etc.) not sufficiently great in connection strength. In these cases, the semiconductor devices are determined unacceptable.

There is a possibility to cause a case with a non-contact (non-connection) in any set of the reference height electrode pair 11a–11d and the reference height electrode 12a–12d, e.g. a case where the active surface 1a and the active surface 1b are not in parallel. In this case, electrical conduction is not available in any of the conduction confirming electrode pairs 7a–7d. In this case, there is a high possibility that no connection (no contact) is made for the small height sum H3+H5 of among the internal connection electrodes 3, 5 in the vicinity of the non-contacted sets of reference height electrode pairs 11a–11d and reference height electrodes 12a–12d. In such a case, the semiconductor device is to be determined unacceptable.

As described above, the semiconductor device thus configured can be determined whether the internal connection electrodes 3, 5 are in electrical connection and the connection as a whole is at a sufficiently high mechanical strength, by examining a presence or absence of an electrical conduction between the reference height electrode pair 11a–11d and the reference height electrode 12a–12d. Moreover, in determination, testing is simple because the number of the reference height electrodes 11, 12 is 4 sets to be examined in presence or absence of an electrical conduction.

Where the internal connection electrodes 3, 5 are many in the number (e.g. exceeding 1000 pins), there is an increased probability that, in one semiconductor device, there is a set of internal connection electrodes 3, 5 having a sum in height smaller than a sum in height of the reference height electrodes 11, 12. In this case, it is satisfactory to reduce the height of the reference height electrode 11, 12, e.g. to a1-4o1, a2-4o2.

It is preferred to provide at least 3 sets of reference height electrodes 11, 12 in the number with a spacing from one another. In this case, even if an abnormality of internal connection results from non-parallelism between the active surface 1a and the active surface 1b, it is possible to know an occurrence of the abnormality. Namely, in such a case, there is a high possibility that any set of reference height electrodes 11, 12 exists in a region which is great in the spacing between the active surface 1a and the active surface 1b (in a region to readily cause a poor connection of the internal connection electrodes 3, 5). Accordingly, there is a high possibility that a poor connection occurs in any set of reference height electrodes 11, 12.

In the invention, however, the number or arrangement of reference height electrodes 11, 12 is not limited to the above but can be desirably fixed depending upon a height accuracy of internal connection electrodes 3, 5 and reference height electrodes 11, 12 and a reproducibility of joining process on these.

Figure 8B:
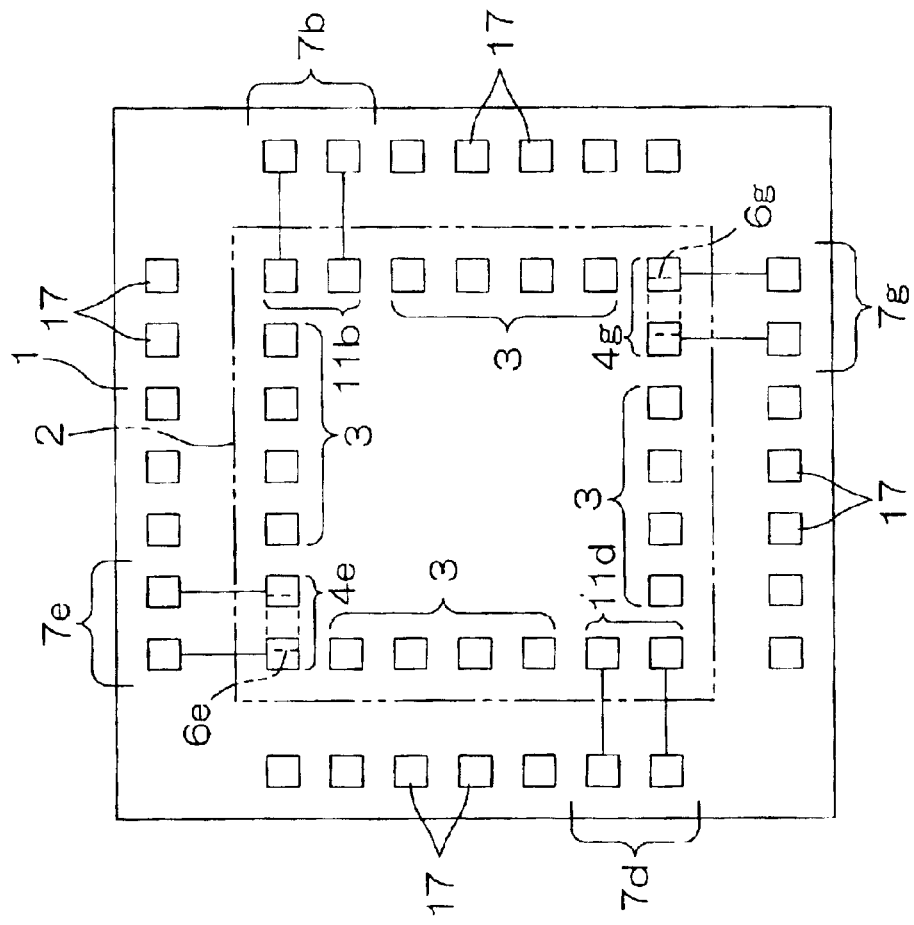
FIGS. 8A and 8B are illustrative plan views showing an arrangement of electrodes on a semiconductor device according to a fourth embodiment of the invention.
Figure 8A:
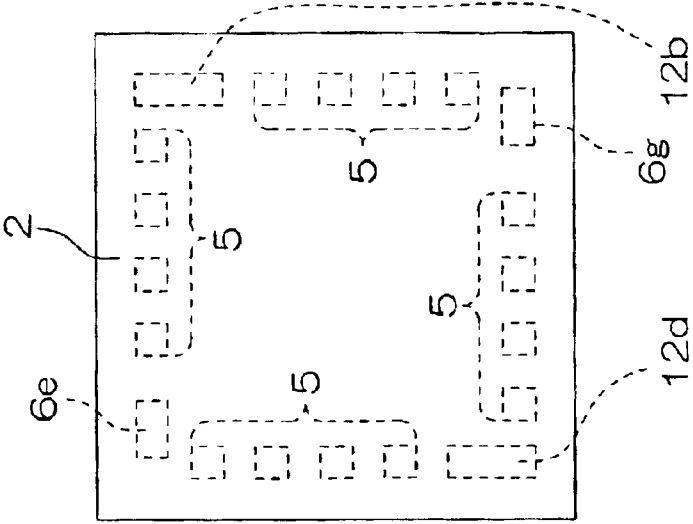

Both the lateral-deviation confirming electrodes 4, 6 and the reference height electrodes 11, 12 may be provided on one semiconductor device. There is shown a fourth embodiment having such a structure in FIGS. 8A and 8B. In this embodiment, lateral-deviation confirming electrodes 6e, 6g are arranged in one pair of diagonal regions on a nearly rectangular child chip 2 while lateral-deviation confirming electrodes 4e, 4g are provided in the corresponding regions on a parent chip 1. Also, reference height electrodes 12b, 12d are arranged in the other pair of diagonal regions on the child chip 2 while lateral-deviation confirming electrodes 11b, 11d are provided in the corresponding regions on the parent chip 1.

Meanwhile, it is possible to structure one set of electrodes serving as both a lateral-deviation confirming electrode 4, 6 and a reference height electrode 11, 12. For example, the reference height electrode 12a–12d may have a width slightly broader than a spacing between two electrodes constituting a reference height electrode pair 11a–11d to short between the paired reference height electrodes 11a–11d, as in the shorting wiring 6e–6h shown in FIGS. 7A–7D.

In this case, connection (contact) is not mane between the reference height electrode pair 11a–11d and the reference height electrode 12a–12d in the case where the internal connection electrodes 3, 5 include those not connected with sufficiently approached in the height direction and/or where they are connected with a deviation in an on-plane direction of the active surface 1a, 1b. Accordingly, by examining a presence or absence of an electrical conduction of between the reference height electrode pair 11a–11d and the reference height electrode 12a–12d, it is possible to know an occurrence of at least any of the above two forms of poor internal connections.

The internal connection electrodes 5 may not be arranged close to the peripheral edge of the child chip 2, e.g. may be arranged in a lattice form all over the entire surface of the active surface 2a. The internal connection electrodes 3 may be arranged in proper positions on the parent chip 1 depending upon an arrangement of the internal connection electrodes 5.

The internal connection electrodes 3, 5, the lateral-deviation confirming electrodes 4, 6 and the reference height electrodes 11, 12 may be formed of soft solder such as solder. In this case, the internal connection electrodes 3, 5 may be connected by fusion/solidification of between them. The deviation width between the lateral-deviation confirming electrodes 4, 6 and the height of the reference height electrode 11, 12 may be determined by taking into account the volume expansion/contraction of the internal connection electrode 3, 5 due to fusion/solidification and the fluidity of a melt.

Figure 9B:
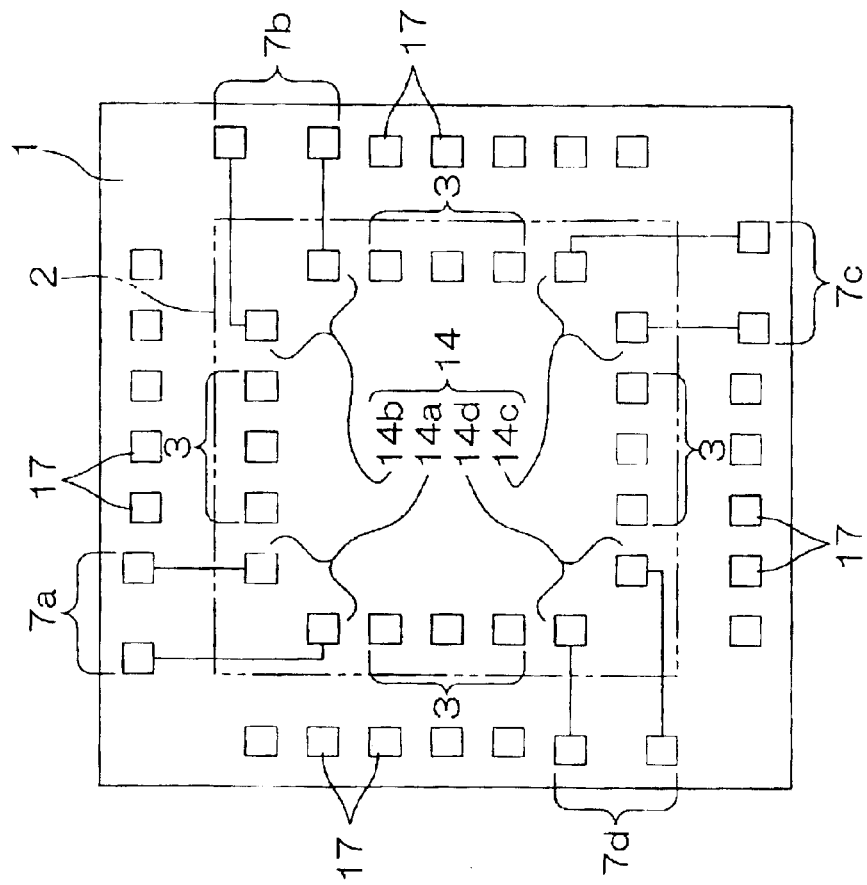
FIGS. 9A and 9B are illustrative plan views showing an arrangement of electrodes on a semiconductor device according to a fifth embodiment of the invention.
Figure 9A:
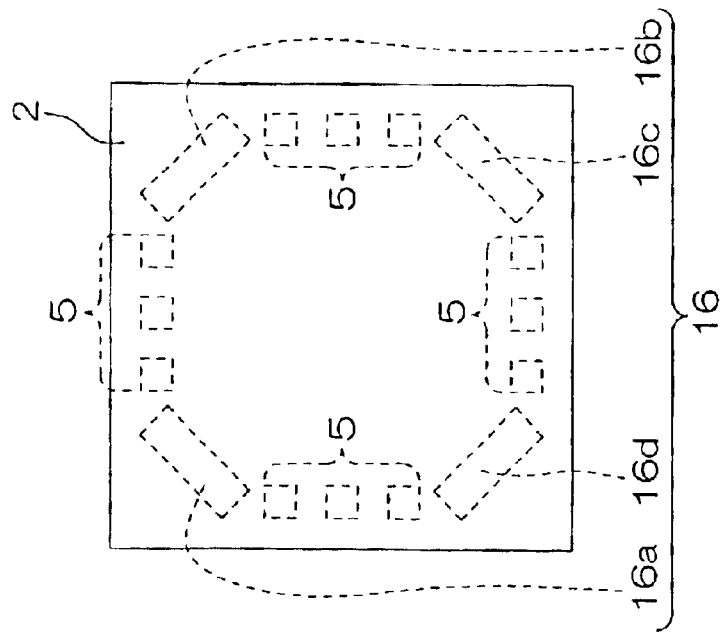

FIGS. 9A and 9B are illustrative plan views showing a structure of a semiconductor device according to a fifth embodiment of the invention. The semiconductor device also has a chip-on-chip structure as shown in FIG. 1. In FIGS. 9A and 9B, the parent chip 1 and the child chip 2 are shown in deviated position. Incidentally, the equivalent elements to those shown in FIGS. 6A and 6B are attached with the same references in FIGS. 9A and 9B.

This embodiment has internal connection electrodes 3 and connection confirming electrode pairs 14 provided on an active surface 1a of the parent chip 1. The internal connection electrodes 3 and the connection confirming electrode pairs 14 are structured as bumps projecting in the same height from the active surface 1a. External extension electrodes 17 are provided close to a peripheral edge of the active surface 1a and where an active surface 2a is not opposed.

On the other hand, the child chip 2 has internal connection electrodes 5 on the active surface 2a thereof, in positions corresponding to the internal connection electrodes 3. Shorting wirings 16 are provided in positions corresponding to the connection confirming electrode pairs 14. The internal connection electrodes 5 and the shorting wirings 16 are structured as bumps projecting in the same height from the active surface 2a. Connection is made between the internal connection electrodes 3 and the internal connection electrodes 5 as well as between the connection confirming electrode pairs 14 and the shorting wirings 16.

The internal connection electrodes 5 and the shorting wirings 16 are arranged close to the peripheral edge on the child chip 2. The internal connection electrodes 5 are arranged long the four sides on the child chip 2. The shorting wirings 16 include four shoring wirings 16a–16d respectively arranged in positions close to the four corners on the child chip 2. In this embodiment, the shorting wirings 16a–16d are formed extending obliquely in a manner cutting the four corners of the child chip 2.

The internal connection electrode 3 and the connection confirming electrode pair 14 are arranged on the parent chip 1, in respective positions corresponding to the internal connection electrode 5 and the shorting wiring 16. The connection confirming electrode pairs 14 include four pair of mutually-spaced connection confirming electrodes 14a–14d. Each connection confirming electrode pair 14a–14d includes two electrodes positioned close to each other. The electrodes constituting the connection confirming electrode pairs 14a–14d and the internal connection electrodes 3 are arranged nearly at an equal interval.

When the child chip 2 is placed in a predetermined position on the child chip 1 (shown by two-dot chain line in FIG. 9B), connection is made between the corresponding ones of the internal connection electrodes 3 and internal connection electrodes 5. In this case, shorting wirings 16a–16d are each connected (contacted) striding the electrodes in a pair constituting the connection confirming electrode pair 14a. This makes the connection confirming electrode pairs 14a–14d in an electrically shorted state. The connection confirming electrode pairs 14a–14d are in an electrically insulated state when the shoring wirings 16 are not connected (contacted) therewith.

Electrical-resistance measuring electrode pairs 7a–7d are connected one-to-one to the connection confirming electrode pairs 14a–14d in positions in line with the external extension electrode 17 but not overlapped with the child chip 2. Namely, one of the electrodes constituting the connection confirming electrode pair 14a–14d is connected to one of the electrodes constituting the electrical-resistance measuring electrode pair 7a–7d while the other one of the electrodes constituting the connection confirming electrode pair 14a–14d is connected to the other one of the electrodes constituting the electrical-resistance measuring electrode pair 7a–7d.

Figure 10A:
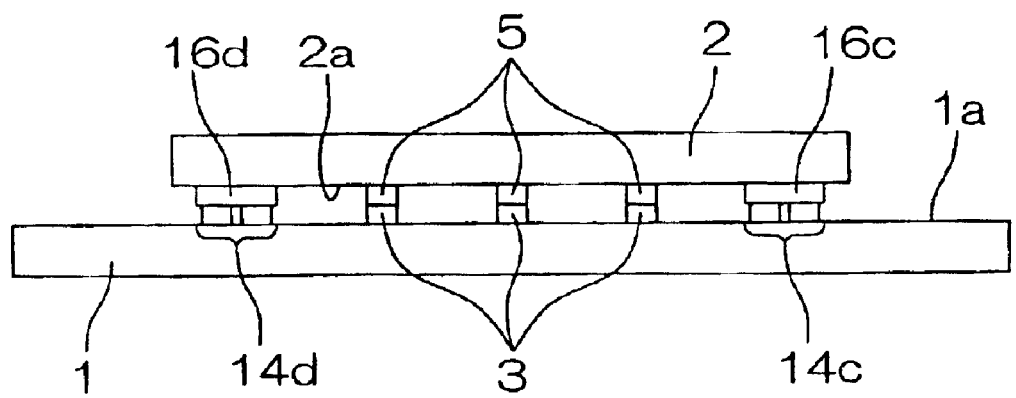
FIGS. 10A and 10B are illustrative side views showing a connection state of between parent and child chips in the semiconductor device of FIGS. 9A and 9B.
Figure 10B:
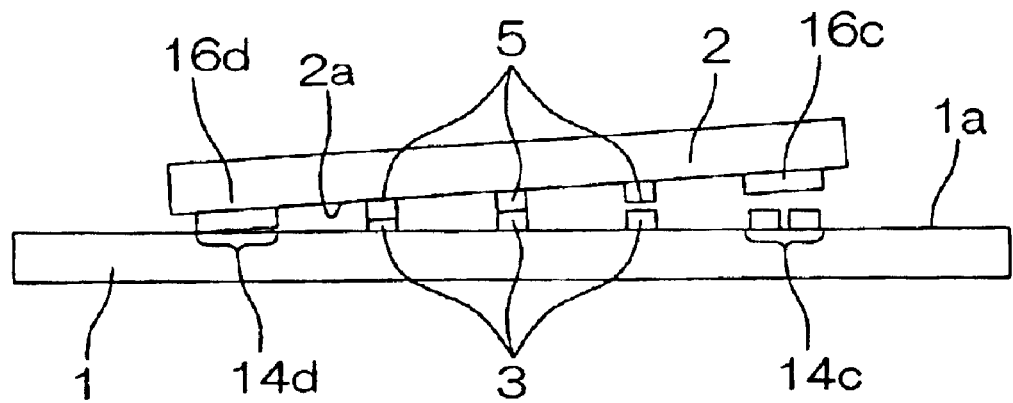

FIGS. 10A and 10B are illustrative side views depicting a connection state of between the parent chip 1 and the child chip 2.

The internal connection electrode 3 and the connection confirming electrode pair 14 have the same height while the internal connection electrode 5 and the shorting wiring 16 have the same height. Accordingly, when the active surface 1a and the active surface 2a are parallel (FIG. 10A), contact is provided between the internal connection electrodes 3 and the internal connection electrodes 5 as well as between the connection confirming electrode pair 14 and the shorting wiring 16. This, however, is on condition that the corresponding ones of the internal connection electrodes 3, 5 have been aligned with each other on the plane. For example, because of sufficiently firm junction (contact) between the connection confirming electrode pair 14a and the shorting wiring 16a, measuring an electrical resistance across the electrical-resistance measuring electrode pair 7a gives a sufficient low value. This is true for the connection confirming electrode pair 14b–14d and shorting wiring 16b–16d.

FIG. 10B shows a case where the active surface 1a and the active surface 2a are not in parallel with each other. Although FIG. 10B shows the case where the child chip 2 is entirely inclined relative to the parent chip 1, this is true for a case, for example, the active surface 1a and the active surface 2a are not in parallel due to unevenness in thickness of the parent chip 1 or child chip 2 (including a case where the parent chip 1 at its lower surface and the child chip 2 at its top surface are parallel).

The spacing between the respective active surfaces 1a, 2a is the narrowest at a corner close to the shorting wiring 16a, 16d but the broadest at a corner close to the shorting wiring 16b, 16c. In this case, contact is provided between the connection confirming electrode pair 14a, 14d and the shorting wiring 16a, 16d, wherein contact is also provided between the internal connection electrodes 3, 5 that are positioned in a constant range from them. Nevertheless, contact is not made between the connection confirming electrode pair 14b, 14c and the shorting wiring 16b, 16c, wherein contact is not provided between the internal connection electrodes 3, 5 that are positioned in a constant range from them. Consequently, although measuring an electrical resistance across the electric-resistance measuring electrode pair 7a, 7d provides a sufficiently low value, conduction is not available in the electric-resistance measuring electrode pair 7b, 7c.

In this manner, it is possible to presume whether or not the active surface 2a and the active surface 2a are in parallel with by measuring an electric resistance across the electric-resistance measuring electrode pair 7a–7d. Namely, in the case where the electric resistance is low in all the electric-resistance measuring electrode pairs 7a–7d, the active surface 1a and the active surface 2a are presumed in parallel with each other. On the other hand, when conduction is not obtained in any of the electrical-resistance measuring electrode pairs 7a–7d, the active surface 1a and the active surface 2a are not in parallel with. It can be presumed that the spacing is maximally broadened in the vicinity of the region where there is the electric-resistance measuring electrode pair 7a–7d that conduction has not been obtained.

In the case where conduction is obtained in the connection confirming electrode pair 14a–14d but a resistance value is high, connection (contact) is not sufficiently firm at between the connection confirming electrode pair 14a–14d and the shorting wiring 16a–16d. Accordingly, the active surface 1a and the active surface 2a are to be presumed not in parallel with. The determination criterion on resistance-value magnitude can be defined on the basis of a case with sufficiently firm connection (contact) between the connection confirming electrode pair 14a–14d and the shorting wiring 16a–16d.

When the active surface 1a and the active surface 2a are presumed not in parallel, there is a high possibility that, besides the connection confirming electrode pair 14a–14d that a conduction has not been obtained or a resistance value has been high, the internal connection electrodes 3, 5 in the vicinity thereof are not in a connection or sufficiently firm junction (contact). Accordingly, it is possible to determine whether the internal connection electrodes 3, 5 are properly connected or not by merely measuring an electrical resistance across the connection confirming electrode pair 14a–14d. Namely, such a semiconductor device can be simply determined for properness of internal connection.

Because the connection confirming electrode pair 14 and the shorting wiring are small in size to have a low electric resistance, it is preferred to measure an electrical resistance across the connection confirming electrode pair 14 (electrical-resistance measuring electrode pair 7) by a four-probe technique. For example, in the electrical-resistance measuring electrode pair 7, measurement can be conducted by putting a voltage-measuring probe (probe needle) on a proximate end of connection of a wiring to the connection confirming electrode pair 14 and an energizing probe on a distal end thereof.

Meanwhile, because the spacing between the active surfaces is to be considered the greatest in the vicinity of the connection confirming electrode pair 14a to 14d where an electrical resistance is higher than a predetermined value or a conduction is not available, it is possible to simply know an approximate inclination direction of the active surface 2a relative to the active surface 1a. By feeding back such information about an inclination of the active surface 2a to the manufacturing process, unacceptable products can be reduced in the number.

The electrical resistance across the electrical-resistance measuring electrode pair 7 is preferably measured during an intermediate test to be conducted prior to molding with a sealing resin 10 (more preferably, prior to wire bonding).

Thus, it is satisfactory to conduct as required a test with greater detail, on a semiconductor device in which electrical resistance among all the connection confirming electrode pair 14a–14d is lower than a prescribed value by putting the probe on every external extension electrode 7 as before.

This is true for a case where the spacing between the active surfaces 1a, 2a is the narrowest at the corner close to the shorting wiring 16a on the child chip 2 and the broadest at the corner close to the shorting wiring 16c. In this case, because the connection confirming electrode pair 14c is not sufficiently firmly connected (contacted) or contacted with the shorting wiring 16c, electrical resistance is high or conduction is not available in the paired electrical-resistance measuring electrode 7c. Thus, it is possible to determine that poor connection is caused on the internal connection electrodes 3, 5 in the vicinity of the connection confirming electrode pair 14c and shorting wiring 16c.

In the case where the active surface 1a and the active surface 2a are not parallel, the active surface 1a and the active surface 2a has the greatest spacing at one or two of the four corners on the child chip 2. Namely, there is no possibility that the active surface 1a and the active surface 2a has the greatest spacing in the vicinity of a center or the like of side on the child chip 2. Accordingly, in this embodiment, the connection confirming electrode pairs 14a–14d are arranged on the parent chip 1, in positions corresponding to the vicinities of the four corners of the child chip 2. Consequently, at least one of the connection confirming electrode pairs 14a–14d necessarily exists in the vicinity of a region where the spacing is the greatest between the both active surfaces 1a, 2a. This makes it possible to locate, with probability, a poor connection in the internal connection electrodes 3, 5.

FIGS. 11A and 11B are illustrative plan views depicting an arrangement of internal connection electrodes, connection confirming electrode pairs and shorting wirings in a semiconductor device according to a sixth embodiment of the invention. The same constituent elements as the constituent elements shown in FIGS. 9A and 9B are attached with the same references in FIGS. 11A and 11B to omit the explanations thereof. In FIGS. 11A and 11B, the parent chip 1 and the child chip 2 are shown deviated in position.

Internal connection electrodes 5 and shorting wirings 16 are arranged close to and along the peripheral edge on the child chip 2. The shorting wirings 16 include four shorting wirings 16e–16h, each of which is formed in a position opposed to a center of and along one of the four sides of the child chip 2. The internal connection electrodes 5 are arranged in the other region.

Internal connection electrodes 3 and connection confirming electrode pairs 14 are arranged on the parent chip 1, respectively corresponding to the internal connection electrodes 5 and the shorting wirings 16. The connection confirming electrode pairs 14 include four pairs of connection confirming electrodes 14e–14h spaced from one another. Each connection confirming electrode pair 14e–14h includes two electrodes positioned close to each other. The two electrodes are arranged correspondingly to both ends of the corresponding shorting wiring 16e–16h. The electrodes constituting the connection confirming electrode pairs 14e–14h and the internal connection electrodes 3 are arranged nearly at an equal interval.

When the child chip 2 is arranged in a predetermined proper position on the parent chip 1 (shown by two-dot chain line in FIG. 11B), the connection confirming electrode pairs 14e–14h are respectively shorted by the shorting wirings 16e–16h. The connection confirming electrode pair 14e–14h is in a state of insulation when the shoring wiring 16e–16h is out of connection (contact).

External extension electrodes 7, in part, are made as electrical-resistance measuring electrode pairs 7e–7h connected one-to-one to the electrodes of the connection confirming electrode pairs 14c–14h.

Similarly to the fifth embodiment, in also the semiconductor device of this embodiment, it is possible to presume as to whether the active surface 1a and the active surface 2a are parallel or not, from a connection state of between the connection confirming electrode pair 14e–14h and the shorting wiring 16e–16h. Through the electrical-resistance measuring electrode pair 7e–7h, it is possible to know by measuring an electric resistance across the connection confirming electrode pair 14e–14h. The active surface 1a and the active surface 2a are to be presumed not parallel in case an electric resistance is high or no conduction is available at between the paired electrodes in any of the connection confirming electrode pairs 14e–14h. This makes it possible to determine a poor connection in the internal connection electrodes 3, 5 in the vicinity of the connection confirming electrode pair 14e to 14h.

In the case where there is a tendency that the child chip 2 inclines relative to the parent chip 1 such that one of a pair of sides is positioned down but the other positioned up, the semiconductor device of this embodiment can suitably determine a connection state in the internal connection electrodes 3, 5. Also, this structure can be provided in the case where there is a difficulty in arranging the connection confirming electrode pairs 14 on a position on the parent chip 1 corresponding to the vicinity of a corner of the child chip 2, in view of semiconductor-device design.

Figure 12B:
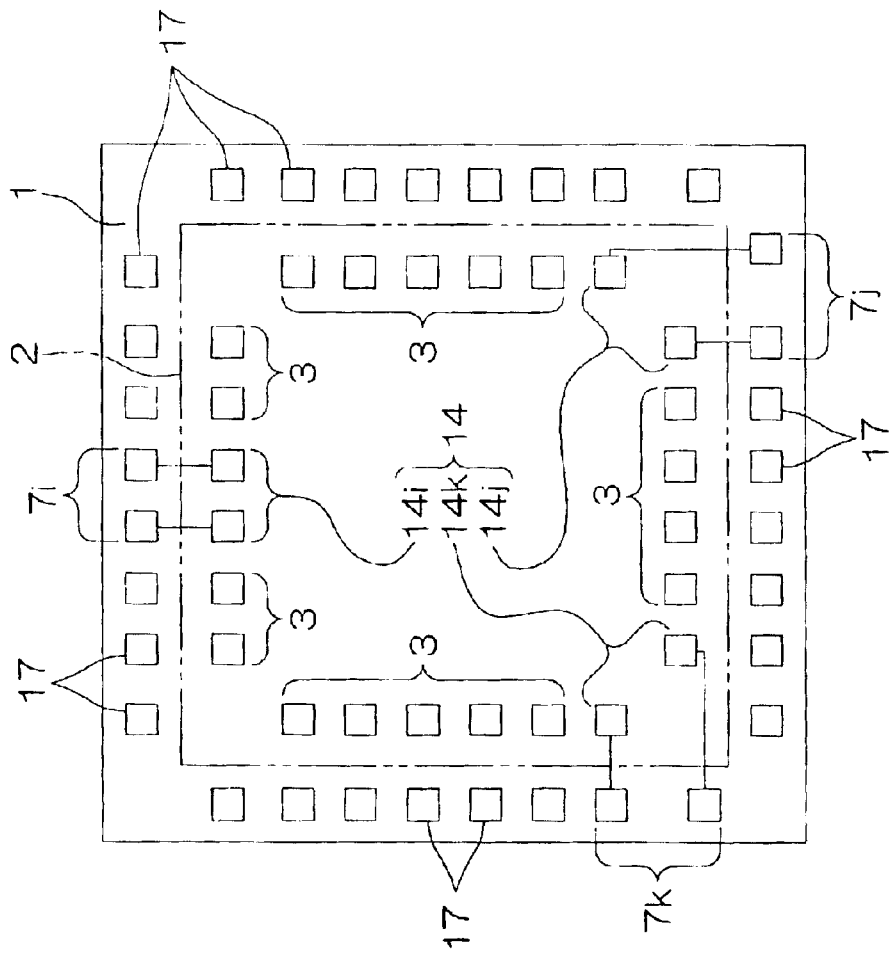
FIGS. 12A and 12B are illustrative plan views showing an arrangement of internal connection electrodes, connection confirming electrode pairs and shorting wirings on a semiconductor device according to a seventh embodiment of the invention.
Figure 12A:
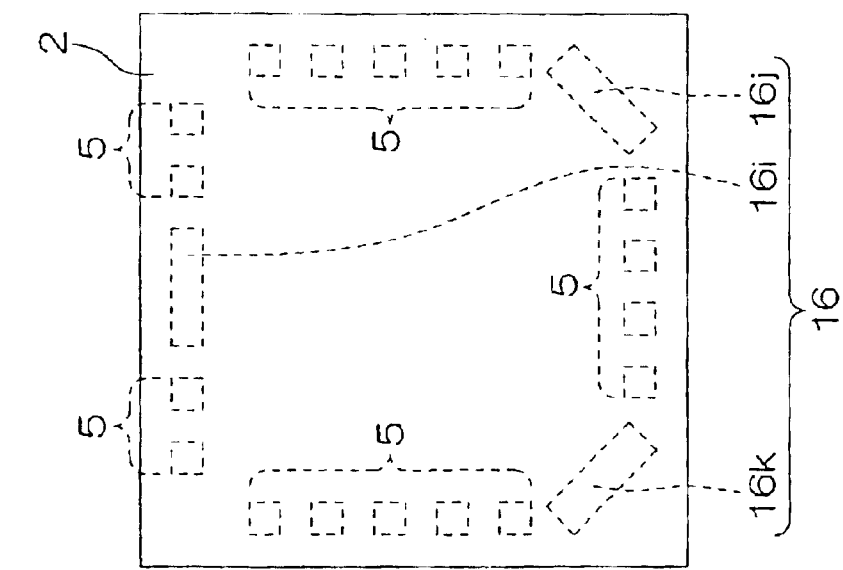

FIGS. 12A and 12B are illustrative plan views depicting an arrangement of internal connection electrodes, connection confirming electrode pairs and shorting wirings in a semiconductor device according to a seventh embodiment of the invention. The same constituent elements as the constituent elements shown in FIGS. 9A and 9B are attached with the same references in FIGS. 12A and 12B to omit the explanations thereof. In FIGS. 12A and 12B, the parent chip 1 and the child chip 2 are shown deviated in position.

Internal connection electrodes 5 and shorting wirings 16 are arranged close to and along the peripheral edge on the child chip 2. Shorting wirings 16 include three shorting wirings 16i–16k, two of which (shorting wirings 16j, 16k) are arranged at around the adjacent corners while the other one (shorting wirings 16i) is arranged in a position opposed to a center of a side opposite to the side connecting between those corners. The internal connection electrodes 5 are arranged in the other region.

Internal connection electrodes 3 and the connection confirming electrode pairs 14 are arranged on the parent chip 1, in positions respectively corresponding to the internal connection electrodes 5 and the shorting wirings 16. The connection confirming electrode pairs 14 include three pairs of connection confirming electrodes 14i–14k spaced from one another. Each connection confirming electrode pair 14i–14k includes two electrodes positioned close to each other. The two electrodes are arranged corresponding to both ends of the corresponding shorting wiring 16e–16h. The electrodes constituting the connection confirming electrode pairs 14i–14k and the internal connection electrodes 3 are arranged nearly at an equal interval.

When the child chip 2 is arranged in a predetermined proper position on the parent chip 1 (shown by two-dot chain line in FIG. 12B), the connection confirming electrode pairs 14i–14k are respectively shorted by the shorting wirings 16i–16k. The connection confirming electrode pair 14i–14k is in a state of insulation when the shoring wiring 16i–16k is out of connection (contact) therewith.

Electrical-resistance measuring electrode pairs 7a–7d are provided one-to-one with the electrodes of the connection confirming electrode pair 14i–14k, in positions in line with the external extension electrode 17 but not overlapped with the child chip 2.

In also the semiconductor device of this embodiment, by measuring an electrical resistance across the electrical-resistance measuring electrode pair 7i–7k, it is possible to determine a connection state in the internal connection electrodes 3, 5 similarly to the fifth and sixth embodiments. In this embodiment, because the connection confirming electrode pairs 14 (electrical-resistance measuring electrode pairs 7) for measuring an electrical resistance are three pairs, it is possible to shorten a time required for measurement and simply determine a properness on a state of internal connection.

In the above embodiment, although the internal connection electrodes 5 were provided only in positions close to the peripheral edge on the child chip 2 in plan view, they may be provided also at the inward. For example, the internal connection electrodes 5 may be arranged in a lattice form over the entire surface of the active surface 2a of the child chip 2.

Meanwhile, in the above embodiment, although only one child chip 2 was overlaid and connected to the parent chip 1, two or more child chips 2 may be superposed and connected to that. In such a case, it is similarly possible to presume, for each child chip 2, whether the active surface 1a and the active surface 2a are in parallel and to determine a properness on a state of internal connection.

The connection confirming electrode pairs 14 may be one or two pairs in the number. In such a case, determination is possible on a connection state of the internal connection electrodes 3, 5 in a vicinity of a position wherein at least the connection confirming electrode pair 14 is provided. Also, the connection confirming electrode pairs 14 may be five pairs or more in the number. In this case, determination is possible on a connection state of the internal connection electrodes 3, 5 with greater correctness. By taking into account a time required in testing and an accuracy in determining an internal connection state, it is possible to determine the number of connection confirming electrode pairs 14.

Where an electrical resistance across the connection confirming electrode pair 14 can be directly measured, there is not necessarily a need to provide the electrical-resistance measuring electrode pairs 7a–7k. In this case, the connection confirming electrode pairs 14 may be provided on the child chip 2 (semiconductor chip not having an external extension electrode 7) while the shorting wirings 16 be on the parent chip 1 (semiconductor chip having an external extension electrode 7).

Although the above embodiments, in any, are on the case one child chip 2 is connected on one parent chip 1, a plurality of child chips 2 may be connected on one parent chip 1.

Although the embodiments of the present invention were explained in detail, they are mere examples used to set forth the subject matter of the invention. The present invention should not be construed limited to the concrete examples but can be limited according to the spirit of the invention and the claims attached herewith.

This invention corresponds to Patent Application No. 2001-302289 filed Sep. 28, 2001 with the Japanese Patent Office and Patent Application No. 2001-339907 filed Nov. 5, 2001 with the Japanese Patent Office, all the disclosures of which applications are incorporated herein by reference.

What is claimed is:

1. A semiconductor device comprising:
    a first semiconductor chip having, on an active surface, a first internal connection electrode and a first lateral-deviation confirming electrode; and
    a second semiconductor chip connected opposed at an active surface thereof to the active surface of the first semiconductor chip and having, on the active surface thereof, a second internal connection electrode corresponding to the first internal connection electrode and a second lateral-deviation confirming electrode corresponding to the first lateral-deviation confirming electrode;
    whereby the first lateral-deviation confirming electrode and the second lateral-deviation confirming electrode are arranged on the respective active surfaces of the first and second semiconductor chips in a positional relationship that mutual connection is made when the first internal connection electrode and the second internal connection electrode are connected together in a predetermined relative position in an on-plane direction of the active surface but mutual connection is not made when the first internal connection electrode and the second internal connection electrode deviate by a constant distance or greater in a predetermined lateral-deviation detecting direction on the plane of the active surface within a range to keep mutual connection thereof.

2. A semiconductor device according to claim 1, wherein the first lateral-deviation electrode and the second lateral-deviation electrode are provided in a plurality of sets, the predetermined lateral-deviation detecting direction is different on between at least two sets of the first lateral-deviation confirming electrodes and the second lateral-deviation confirming electrodes.

3. A semiconductor device according to claim 1, wherein the first semiconductor chip further comprises a pair of conduction confirming electrodes respectively connected to the first lateral-deviation confirming electrode and the first internal connection electrode, the second semiconductor chip further comprising a wiring connecting between the second lateral-deviation confirming electrode connected to the first lateral-deviation confirming electrode and the second internal connection electrode connected to the first internal connection electrode.

4. A semiconductor device according to claim 1, wherein the first and second lateral-deviation confirming electrodes are arranged to be superposed with a positional deviation from each other when the first and second internal connection electrodes are in a predetermined relative position.

5. A semiconductor device according to claim 1, wherein one of the first and second lateral-deviation confirming electrodes includes a pair of connection confirming electrodes while the other one of the first and second lateral-deviation confirming electrodes includes a shorting wiring electrically shorting between the one pair of connection confirming electrodes, the first lateral-deviation confirming electrode and the second lateral-deviation confirming electrode being arranged on the respective active surfaces of the first and second semiconductor chips in a positional relationship that the one pair of connection confirming electrodes are shorted by the shorting wiring when the first internal connection electrode and the second internal connection electrode are connected together in the predetermined relative position but the one pair of connection confirming electrodes are not shorted by the shorting wiring when the first internal connection electrode and the second internal connection electrode deviate by a constant distance or greater in the predetermined lateral-deviation detecting direction within a range to keep mutual connection thereof.

6. A semiconductor device comprising:
a first semiconductor chip having a plurality of first internal connection electrodes and a first reference-height electrode, projecting from an active surface thereof; and
a second semiconductor chip connected opposed at an active surface thereof to an active surface of the first semiconductor chip and having a plurality of second internal connection electrodes corresponding to the first internal connection electrodes and a second reference height electrode corresponding to the first reference height electrode, projecting from the active surface;
whereby the sum of a height of the first reference height electrode and a height of the second reference height electrode, before connecting together the first and second semiconductor chips, is smaller than a minimal one of the sums of a height of the first internal connection electrode and a height of the corresponding second internal connection electrode of before the connection.

7. A semiconductor device according to claim 6, wherein the first reference height electrode includes one pair of electrodes formed in a same height, the second reference height electrode is allowed to short between the one pair of electrodes.

8. A semiconductor device according to claim 7, wherein the first semiconductor chip further comprises, on the active surface thereof, one pair of conduction confirming electrodes respectively connected to the one pair of electrodes.

9. A semiconductor device according to claim 6, wherein the first semiconductor chip further comprises on the active surface thereof a first lateral-deviation confirming electrode, the second semiconductor chip further comprising on the active surface thereof a second lateral-deviation confirming electrode corresponding to the first lateral-deviation confirming electrode, wherein the first lateral-deviation confirming electrode and the second lateral-deviation confirming electrode are arranged on the respective active surfaces of the first and second semiconductor chips in a positional relationship that mutual connection is made when the first internal connection electrode and the second internal connection electrode are connected together in a predetermined relative position on the active surface but mutual connection is not made when the first internal connection electrode and the second internal connection electrode deviates by a constant distance or greater in a predetermined lateral-deviation detecting direction on the plane of the active surface within a range to keep mutual connection thereof.

10. A semiconductor device comprising:
a first semiconductor chip having a first internal connection electrode and at least one pair of connection confirming electrodes; and
a second semiconductor chip connected opposed to the first semiconductor chip, having a second internal connection electrode corresponding to the first internal connection electrode, and a shorting wiring shorting between the pair of connection confirming electrodes when the second semiconductor chip is arranged in a predetermined position on the first semiconductor chip;
wherein the first semiconductor chip includes one pair of electrical-resistance measuring electrodes respectively connected to the pair of connection confirming electrodes.

11. A semiconductor device according to claim 10, wherein the pair of connection confirming electrodes are arranged close to the first internal connection electrode.

12. A semiconductor device according to claim 10, wherein the pair of connection confirming electrodes include at least three pairs arranged spaced from one another.

13. A semiconductor device according to claim 10, wherein the pair of connection confirming electrodes are arranged in positions corresponding to a peripheral edge region of the second semiconductor chip.

14. A semiconductor device according to claim 10, wherein the second semiconductor chip is rectangular, the pair of connection confirming electrodes are arranged on the first semiconductor chip in a position corresponding to a vicinity of a corner of the second semiconductor chip.

* * * * *